(12) United States Patent
Huang et al.

(10) Patent No.: US 12,374,525 B2
(45) Date of Patent: Jul. 29, 2025

(54) PLASMA PROCESSING TOOL AND OPERATING METHOD THEREOF

(71) Applicant: TAIWAN SEMICONDUCTOR MANUFACTURING COMPANY, LTD., Hsinchu (TW)

(72) Inventors: Yung Chang Huang, Taichung (TW); Chia Jung Hsu, Tainan (TW); Yu Hsiu Chen, Tainan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 733 days.

(21) Appl. No.: 17/688,120

(22) Filed: Mar. 7, 2022

(65) Prior Publication Data
US 2023/0010751 A1    Jan. 12, 2023

Related U.S. Application Data

(60) Provisional application No. 63/220,192, filed on Jul. 9, 2021.

(51) Int. Cl.
*H01J 37/32* (2006.01)
*C23C 14/34* (2006.01)

(52) U.S. Cl.
CPC ........ *H01J 37/32082* (2013.01); *C23C 14/34* (2013.01); *H01J 37/3211* (2013.01); *H01J 2237/332* (2013.01)

(58) Field of Classification Search
None
See application file for complete search history.

(56) References Cited

U.S. PATENT DOCUMENTS

| 5,879,575 A | * | 3/1999 | Tepman | ............ H01J 37/32862 |
| | | | | 118/723 MP |
| 6,238,532 B1 | * | 5/2001 | Rossnagel | ............. H01J 37/321 |
| | | | | 118/724 |

* cited by examiner

*Primary Examiner* — Jason Berman
(74) *Attorney, Agent, or Firm* — Birch, Stewart, Kolasch & Birch, LLP

(57) ABSTRACT

The method includes placing a wafer in a chamber body of a plasma processing tool; moving a first movable jig along an arc path to comb a spiral-shaped radio frequency (RF) coil over the chamber body, the first movable jig having a plurality of first confining slots penetrated by a plurality of coil segments of the spiral-shaped RF coil, respectively; and generating plasma in the chamber body through the spiral-shaped RF coil.

20 Claims, 18 Drawing Sheets

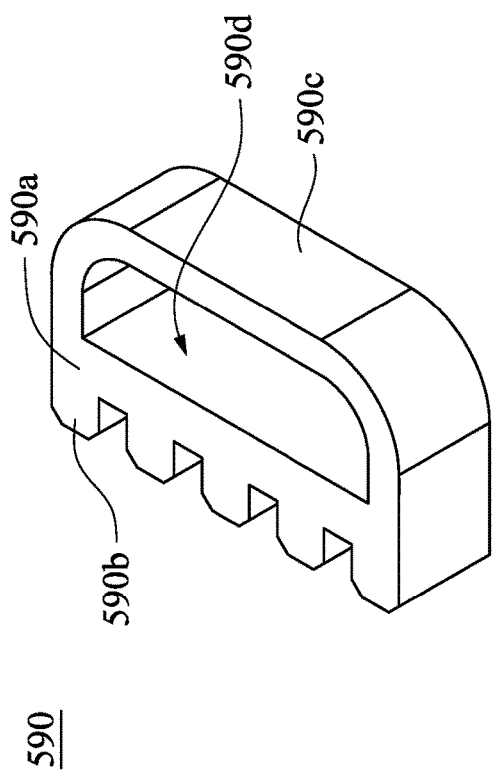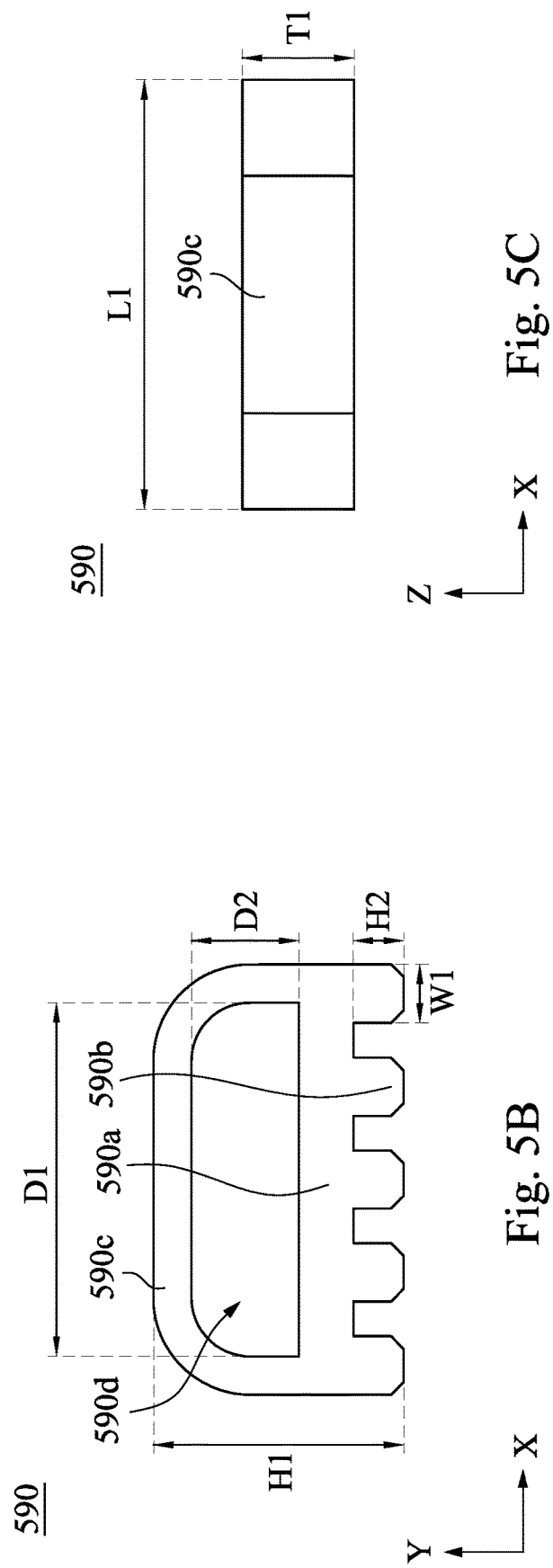

PLASMA PROCESSING TOOL AND OPERATING METHOD THEREOF

PRIORITY CLAIM AND CROSS-REFERENCE

This application claims priority to U.S. Provisional Application Ser. No. 63/220,192, filed Jul. 9, 2021, which is herein incorporated by reference in its entirety.

BACKGROUND

A plasma processing tool is capable of processing a substrate in an energized process gas. The plasma processing tool comprises an enclosure wall that encloses a process zone into which a process gas may be introduced, a gas energizer to energize the process gas, and an exhaust to exhaust the process gas. The enclosure wall is to facilitate post-process cleaning of the enclosure wall. A plasma processing tool may, for example, be used to deposit material on a substrate or to etch material from a substrate, for example, by sputter etching a substrate surface before a subsequent deposition process is conducted on the substrate. The sputter etching process may, for example, remove a native oxide layer from the surface of a metal layer before a metal deposition step so that the deposited metal can make good electrical contact with the underlying metal layer of the substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5A-5C illustrate perspective, top, and side views of a movable jig in accordance with some embodiments of the present disclosure.

DETAILED DESCRIPTION

Figure 1:
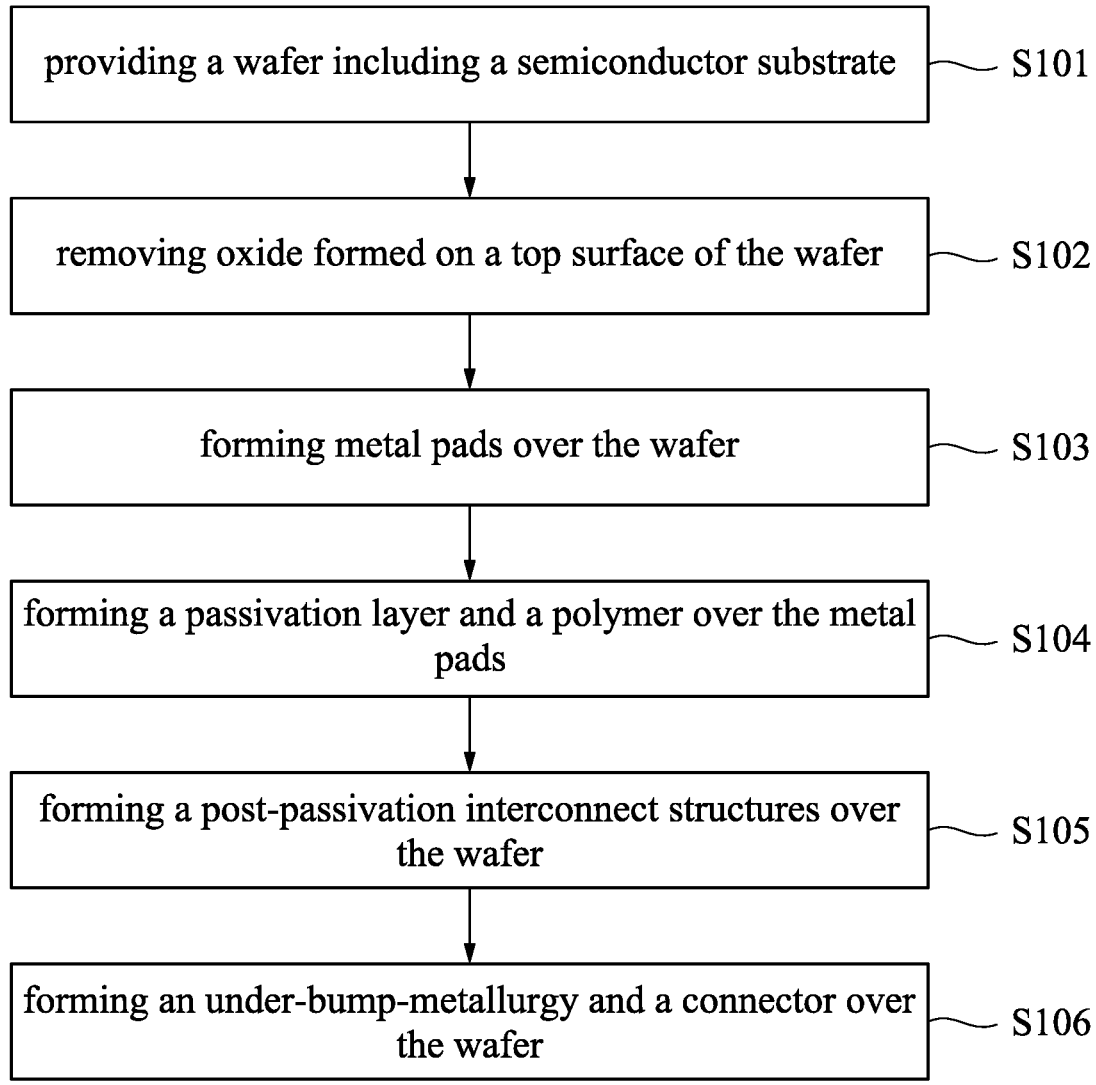
FIG. 1 is a flowchart of a method for forming a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature, over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" may mean within 20 percent, or within 10 percent, or within 5 percent of a given value or range. One skilled in the art will realize, however, that the value or range recited throughout the description are merely examples, and may be reduced with the down-scaling of the integrated circuits. Numerical quantities given herein are approximate, meaning that the term "around," "about," "approximately," or "substantially" can be inferred if not expressly stated.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In order to perform a plasma etching process on a processing wafer to remove oxide over the metal layer, a radio frequency (RF) resonator including a spiral-shaped RF coil is provided. Because the electrical field used to dissociate the process gas to form the plasma is generated by the spiral-shaped RF coil, the uniformity of the plasma may be affected by the structure of the spiral-shaped RF coil. For example, if adjacent two coil segments of the spiral-shaped RF coil move, a variable gap therebetween may be changed, thereby causing an uneven distribution of the plasma over the processing wafer. The uneven distribution of the plasma may cause different ions sputter etch rate on the different regions of the wafer, such that the oxide on the wafer may not be completely removed, which in turn deteriorates electrical contact between the subsequently deposited metal and the underlying metal layer and may cause voltage breakdown (VBD) fail to the wafer.

Therefore, the present disclosure in various embodiments provides a movable jig installed in the RF resonator. The movable jig is used to position the spiral-shaped RF coil on the inner sidewall of the RF resonator to confine any adjacent two coil segments of the spiral-shaped RF coil in a fixed gap along a spiral direction. As a result, the plasma uniformity can be improved, which in turn improves etch rates on different regions of the wafer, such that the oxide on the processing wafer may be completely removed to improve the electrical contact between the subsequently deposited metal and the underlying metal layer.

Referring now to FIG. 1, illustrated is a flowchart of an exemplary method M for fabrication of a semiconductor structure in accordance with some embodiments. The method M includes a relevant part of the entire manufacturing process. It is understood that additional operations may be provided before, during, and after the operations shown by FIG. 1, and some of the operations described below can be replaced or eliminated for additional embodiments of the method. The order of the operations/processes may be interchangeable. The method M includes fabrication of a semiconductor device. However, the fabrication of the semiconductor device is merely an example for describing the manufacturing process according to some embodiments of the present disclosure.

Figure 2A:
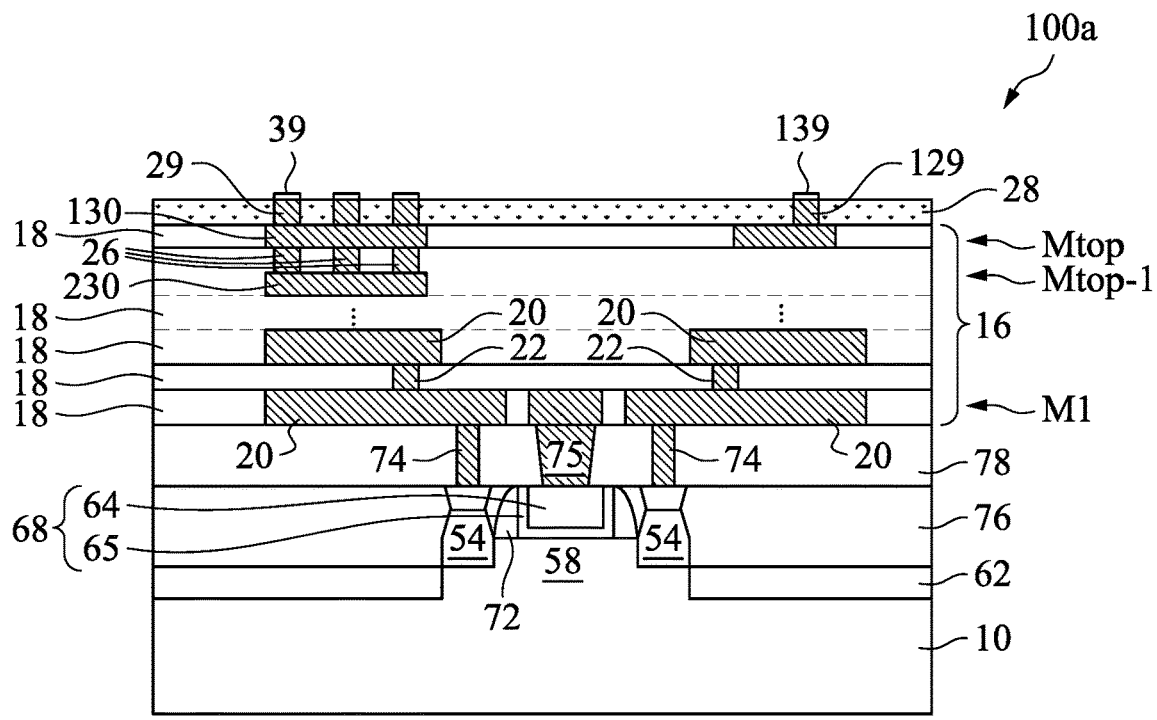
FIGS. 2A-2F illustrate a method in various stages of forming a semiconductor structure in accordance with some embodiments of the present disclosure.

FIGS. 2A-2F illustrate the method M in various stages of forming a wafer 100a in accordance with some embodiments of the present disclosure. The method M begins at block S101 where a wafer including semiconductor substrate is provided. Referring to FIG. 2A, in some embodiments of block S101, Referring to FIG. 1, a wafer 100a, which includes a semiconductor substrate 10, is provided. The semiconductor substrate 10 may be a bulk silicon substrate or a silicon-on-insulator substrate. Alternatively, other semiconductor materials that include group III, group IV, and group V elements may also be used, which may include silicon germanium, silicon carbon, and III-V compound semiconductor materials.

A semiconductor device 64, which are symbolized using a transistor, may be formed at a surface of the semiconductor substrate 10. A fin-type field effect transistor (FinFET) device is disposed on the substrate 10. In some embodiments, the FinFET device illustrated in FIG. 2A is a three-dimensional MOSFET structure formed in fin-like strips of semiconductor protrusions 58 referred to as fins. The cross-section shown in FIG. 2A is taken along a longitudinal axis of the fin in a direction parallel to the direction of the current flow between the source and drain regions 54. The fin 58 may be formed by patterning the substrate using photolithography and etching techniques. For example, a spacer image transfer (SIT) patterning technique may be used. In this method a sacrificial layer is formed over a substrate and patterned to form mandrels using suitable photolithography and etch processes. Spacers are formed alongside the mandrels using a self-aligned process. The sacrificial layer is then removed by an appropriate selective etch process. Each remaining spacer may then be used as a hard mask to pattern the respective fin 58 by etching a trench into the substrate 10 using, for example, reactive ion etching (RIE). FIG. 2A illustrates a single fin 58, although the substrate 10 may include any number of fins.

Shallow trench isolation (STI) regions 62 formed along opposing sidewalls of the fin 58 are illustrated in FIG. 2A. STI regions 62 may be formed by depositing one or more dielectric materials (e.g., silicon oxide) to completely fill the trenches around the fins and then recessing the top surface of the dielectric materials. The dielectric materials of the STI regions 62 may be deposited using a high density plasma chemical vapor deposition (HDP-CVD), a low-pressure CVD (LPCVD), sub-atmospheric CVD (SACVD), a flowable CVD (FCVD), spin-on, and/or the like, or a combination thereof. After the deposition, an anneal process or a curing process may be performed. In some cases, the STI regions 62 may include a liner such as, for example, a thermal oxide liner grown by oxidizing the silicon surface. The recess process may use, for example, a planarization process (e.g., a chemical mechanical polish (CMP)) followed by a selective etch process (e.g., a wet etch, or dry etch, or a combination thereof) that may recess the top surface of the dielectric materials in the STI region 62 such that an upper portion of fins 58 protrudes from surrounding insulating STI regions 62. In some cases, the patterned hard mask used to form the fins 58 may also be removed by the planarization process.

In some embodiments, the gate structure 68 of the FinFET device illustrated in FIG. 2A is a high-k, metal gate (HKMG) gate structure that may be formed using a gate-last process flow. In a gate last process flow, a sacrificial dummy gate structure (not shown) is formed after forming the STI regions 62. The dummy gate structure may include a dummy gate dielectric, a dummy gate electrode, and a hard mask. First a dummy gate dielectric material (e.g., silicon oxide, silicon nitride, or the like) may be deposited. Next a dummy gate material (e.g., amorphous silicon, polycrystalline silicon, or the like) may be deposited over the dummy gate dielectric and then planarized (e.g., by CMP). A hard mask layer (e.g., silicon nitride, silicon carbide, or the like) may be formed over the dummy gate material. The dummy gate structure is then formed by patterning the hard mask and transferring that pattern to the dummy gate dielectric and dummy gate material using suitable photolithography and etching techniques. The dummy gate structure may extend along multiple sides of the protruding fins and extend between the fins over the surface of the STI regions 62. As described in greater detail below, the dummy gate structure may be replaced by the HKMG gate structure 68 as illustrated in FIG. 2A. The materials used to form the dummy gate structure and hard mask may be deposited using any suitable method such as CVD, plasma-enhanced CVD (PECVD), atomic layer deposition (ALD), plasma-enhanced ALD (PEALD) or the like, or by thermal oxidation of the semiconductor surface, or combinations thereof.

Source and drain regions 54 and spacers 72 of FinFET, illustrated in FIG. 2A, are formed, for example, self-aligned to the dummy gate structure. Spacers 72 may be formed by deposition and anisotropic etch of a spacer dielectric layer performed after the dummy gate patterning is complete. The spacer dielectric layer may include one or more dielectrics, such as silicon oxide, silicon nitride, silicon oxynitride, silicon carbide, silicon carbonitride, the like, or a combination thereof. The anisotropic etch process removes the spacer dielectric layer from over the top of the dummy gate structure leaving the spacers 72 along the sidewalls of the dummy gate structure extending laterally onto a portion of the surface of the fin (as illustrated in the right side of FIG. 2A) or the surface of the STI dielectric (as illustrated in the left side of FIG. 2A).

Source and drain regions 54 are semiconductor regions in direct contact with the semiconductor fin 58. In some embodiments, the source and drain regions 54 may include heavily-doped regions and relatively lightly-doped drain extensions, or LDD regions. Generally, the heavily-doped regions are spaced away from the dummy gate structure using the spacers 72, whereas the LDD regions may be formed prior to forming spacers 72 and, hence, extend under the spacers 72 and, in some embodiments, extend further into a portion of the semiconductor below the dummy gate structure. The LDD regions may be formed, for example, by implanting dopants (e.g., As, P, B, In, or the like) using an ion implantation process.

The source and drain regions 54 may include an epitaxially grown region. For example, after forming the LDD regions, the spacers 72 may be formed and, subsequently, the heavily-doped source and drain regions may be formed self-aligned to the spacers 72 by first etching the fins to form recesses, and then depositing a crystalline semiconductor material in the recess by a selective epitaxial growth (SEG) process that may fill the recess and, typically, extend beyond the original surface of the fin to form a raised source-drain structure, as illustrated in FIG. 2A. The crystalline semiconductor material may be elemental (e.g., Si, or Ge, or the like), or an alloy (e.g., $Si_{1-x}C_x$, or $Si_{1-x}Ge_x$, or the like). The SEG process may use any suitable epitaxial growth method, such as e.g., vapor/solid/liquid phase epitaxy (VPE, SPE, LPE), or metal-organic CVD (MOCVD), or molecular beam epitaxy (MBE), or the like. A high dose (e.g., from about $10^{14}$ cm$^{-2}$ to $10^{16}$ cm$^{-2}$) of dopants may be introduced into the heavily-doped source and drain regions 54 either in situ during SEG, or by an ion implantation process performed after the SEG, or by a combination thereof.

An interlayer dielectric (ILD) 76 (seen in FIG. 2A) is deposited over the structure. In some embodiments, a contact etch stop layer (CESL) (not shown) of a suitable dielectric (e.g., silicon nitride, silicon carbide, or the like, or a combination thereof) may be deposited prior to depositing the ILD material. A planarization process (e.g., CMP) may be performed to remove excess ILD material and any remaining hard mask material from over the dummy gates to form a top surface wherein the top surface of the dummy gate material is exposed and may be substantially coplanar with the top surface of the ILD layer 76. The HKMG gate structure 68, illustrated in FIG. 2A, may then be formed by first removing the dummy gate structure using one or more etching techniques, thereby creating trenches between respective spacers 72. Subsequently, a replacement gate dielectric layer 65 comprising one more dielectrics, followed by a replacement conductive gate layer 64 comprising one or more conductive materials, are deposited to completely fill the recesses. Excess portions of the gate structure layers 64 and 65 may be removed from over the top surface of ILD layer 76 using, for example a CMP process. The resulting structure, as illustrated in FIG. 2A, may be a substantially coplanar surface comprising an exposed top surface of ILD layer 76, spacers 72, and remaining portions of the HKMG gate layers 65 and 64 inlaid between respective spacers 72.

The gate dielectric layer 65 includes, for example, a high-k dielectric material such as oxides and/or silicates of metals (e.g., oxides and/or silicates of Hf, Al, Zr, La, Mg, Ba, Ti, and other metals), silicon nitride, silicon oxide, and the like, or combinations thereof, or multilayers thereof. In some embodiments, the conductive gate layer 64 may be a multilayered metal gate stack comprising a barrier layer, a work function layer, and a gate-fill layer formed successively on top of gate dielectric layer 65. Example materials for a barrier layer include TiN, TaN, Ti, Ta, or the like, or a multilayered combination thereof. A work function layer may include TiN, TaN, Ru, Mo, Al, for a p-type FET, and Ti, Ag, TaAl, TaAlC, TiAlN, TaC, TaCN, TaSiN, Mn, Zr, for an n-type FET. Other suitable work function materials, or combinations, or multilayers thereof may be used. The gate-fill layer which fills the remainder of the recess may include metals such as Cu, Al, W, Co, Ru, or the like, or combinations thereof, or multi-layers thereof. The materials used in forming the gate structure may be deposited by any suitable method, e.g., CVD, PECVD, PVD, ALD, PEALD, electrochemical plating (ECP), electroless plating and/or the like.

Source/drain contacts 73 are formed in the ILD layer 76 and make electrical connections to the source and drain regions 54 of FinFET. The source/drain contacts 73 may be formed using photolithography techniques. For example, a patterned mask may be formed over the ILD layer 76 and used to etch openings that extend through the ILD layer 76 and the CESL (not shown) below ILD layer 76 to expose portions of the source and drain regions 54. In some embodiments, an anisotropic dry etch process may be used.

In some embodiments, a conductive liner may be formed in the openings in the ILD layer 76. Subsequently, the openings are filled with a conductive fill material. The liner includes barrier metals used to reduce out-diffusion of conductive materials from the source/drain contacts 73 into the surrounding dielectric materials. In some embodiments, the liner may include two barrier metal layers. The first barrier metal comes in contact with the semiconductor material in the source and drain regions 54 and may be subsequently chemically reacted with the heavily-doped semiconductor in the source and drain regions 54 to form a low resistance ohmic contact, after which the unreacted metal may be removed. For example, if the heavily-doped semiconductor in the source and drain regions 54 is silicon or silicon-germanium alloy semiconductor, then the first barrier metal may include Ti, Ni, Pt, Co, other suitable metals, or their alloys. The second barrier metal layer of the conductive liner may additionally include other metals (e.g., TiN, TaN, Ta, or other suitable metals, or their alloys). A conductive fill material (e.g., W, Al, Cu, Ru, Ni, Co, alloys of these, combinations thereof, and the like) may be deposited over the conductive liner layer to fill the contact openings, using any acceptable deposition technique (e.g., CVD, ALD, PEALD, PECVD, PVD, ECP, electroless plating, or the like, or any combination thereof). Next, a planarization process (e.g., CMP) may be used to remove excess portions of all the conductive materials from over the surface of the ILD layer 76. The resulting conductive plugs extend into the ILD layer 76 and constitute the source/drain contacts 73 making physical and electrical connections to the electrodes of electronic devices, such as the FinFET illustrated in FIG. 2A.

A ILD layer 78 may be deposited over the ILD layer 76, as illustrated in FIG. 2A. In some embodiments, the insulating materials to form the ILD layer 76 and the ILD layer 78 may include silicon oxide, phosphosilicate glass (PSG), borosilicate glass (BSG), boron-doped phosphosilicate glass (BPSG), undoped silicate glass (USG), a low dielectric constant (low-k) dielectric such as, fluorosilicate glass (FSG), silicon oxycarbide (SiOCH), carbon-doped oxide (CDO), flowable oxide, or porous oxides (e.g., xerogels/aerogels), or the like, or a combination thereof. The dielectric materials used to form the ILD layer 76 and the ILD layer 78 may be deposited using any suitable method, such as CVD, physical vapor deposition (PVD), ALD, PEALD, PECVD, SACVD, FCVD, spin-on coating, and/or the like, or a combination thereof.

As illustrated in FIG. 2A, source/drain vias 74 are formed in the ILD layer 78 and making electrical connections to corresponding source/drain contacts 73. Gate contact 75 are formed in the ILD layer 78 and making electrical connection to corresponding gate electrode 64 of FinFET, respectively. The gate contact 75, the source/drain contacts 73, and the source/drain vias 74 can be referred to as middle-end-of-line (MEOL) conductive features that electrically connect front-end-of-line (FEOL) conductive features (for example, gate structure 68 and/or source/drain regions 54) to back-end-of-line (BEOL) conductive features (for example, metal vias and metal lines in an interconnect structure 16). The gate contact 75 and the source/drain vias 74 may be formed using photolithography techniques. For example, a patterned mask may be formed over the ILD layer 78 and used to etch openings that extend through the ILD layer 78 to expose a portion of gate electrode over STI regions 62 and the source/drain contacts 73. In some embodiments, an anisotropic dry etch process may be used to etch the openings.

In some embodiments, a conductive liner may be formed in the openings in the ILD layer 78. Subsequently, the openings are filled with a conductive fill material. The liner includes barrier metals used to reduce out-diffusion of conductive materials from the gate contact 75 and the source/drain vias 74 into the surrounding dielectric materials. In some embodiments, the liner may include two barrier metal layers. The first barrier metal may include Ti, Ni, Pt, Co, other suitable metals, or their alloys. The second barrier metal layer of the conductive liner may additionally include other metals (e.g., TiN, TaN, Ta, or other suitable metals, or their alloys). A conductive fill material may be deposited over the conductive liner layer to fill the contact openings, using any acceptable deposition technique (e.g., CVD, ALD, PEALD, PECVD, PVD, ECP, electroless plating, or the like, or any combination thereof). The conductive fill material may be tungsten (W) or other suitable conductive materials, such as Al, Cu, Ru, Ni, Co, alloys of these, combinations thereof, and the like. Next, a planarization process (e.g., CMP) may be used to remove excess portions of all the conductive materials from over the surface of the second ILD layer 78. The resulting conductive plugs extend into the second ILD layer 78 and constitute gate contact 75 and the source/drain vias 74 making physical and electrical connections to the gate electrode 64 and the source/drain contacts 73, respectively.

In some embodiments, each of the source/drain contacts 73, the source/drain vias 74, and the gate contact 75 may include an inverted trapezoid cross-sectional profile. That is, widths of the source/drain contacts 73, the source/drain vias 74, and the gate contact 75 may increase as a distance from the substrate 10 increases.

The wafer 100a may further include an interconnect structure 16 over the ILD layer 78. The interconnect structure 16 includes metal lines 20 and metal vias 22, which are formed in dielectric layers 18. The combination of the metal lines 20 at a same level is referred to a metal layer hereinafter. Accordingly, the interconnect structure 16 may include a plurality of metal layers that are interconnected through the metal vias 22. The metal lines 20 and metal vias 22 may be formed of copper or copper alloys, although they can also be formed of other metals. In some embodiments, the metal lines 20 and/or metal vias 22 may include a conducting material, for example, metals such as Al, Ti, TiN, TaN, Co, Ag, Au, Ni, Cr, Hf, Ru, W, Pt, WN, Ru, any other suitable material or a combination or alloy thereof. In some embodiments, the dielectric layers 18 are formed of low-k dielectric materials. The dielectric constants (k values) of the low-k dielectric materials may be less than about 3.0, or less than about 2.5, for example.

In some embodiments, the metal layers include a bottom metal layer (M1) through a top metal layer (Mtop). In some embodiments, the Mtop layer is the topmost metal layer that is formed in low-k dielectric materials. A metal pad 130 may be formed in the Mtop layer. A metal pad 230 may also be formed in Mtop−1 layer, which is the metal layer immediately underlying the Mtop layer. The metal pads 130 and 230 are interconnected through metal vias 26.

In some embodiments, a passivation layer 28 is formed over the top metal layer Mtop and the respective dielectric layer 18 in which the metal layer Mtop is located. The passivation layer 28 has a k value greater than 3.8, and is formed using a non-low-k dielectric material. In some embodiments, the passivation layer 28 is a composite layer comprising a silicon oxide layer (not shown), and a silicon nitride layer (not shown) over the silicon oxide layer. The passivation layer 28 may also be formed of other non-porous dielectric materials such as un-doped silicate glass (USG), silicon oxynitride, and/or the like. Metal vias 29 and 129 are formed in the passivation layer 28, and may be electrically coupled to the integrated circuit devices 12 through the metal pad 130. Native oxide layers 39 and 139 are formed on the metal vias 29 and 129.

Figure 2B:
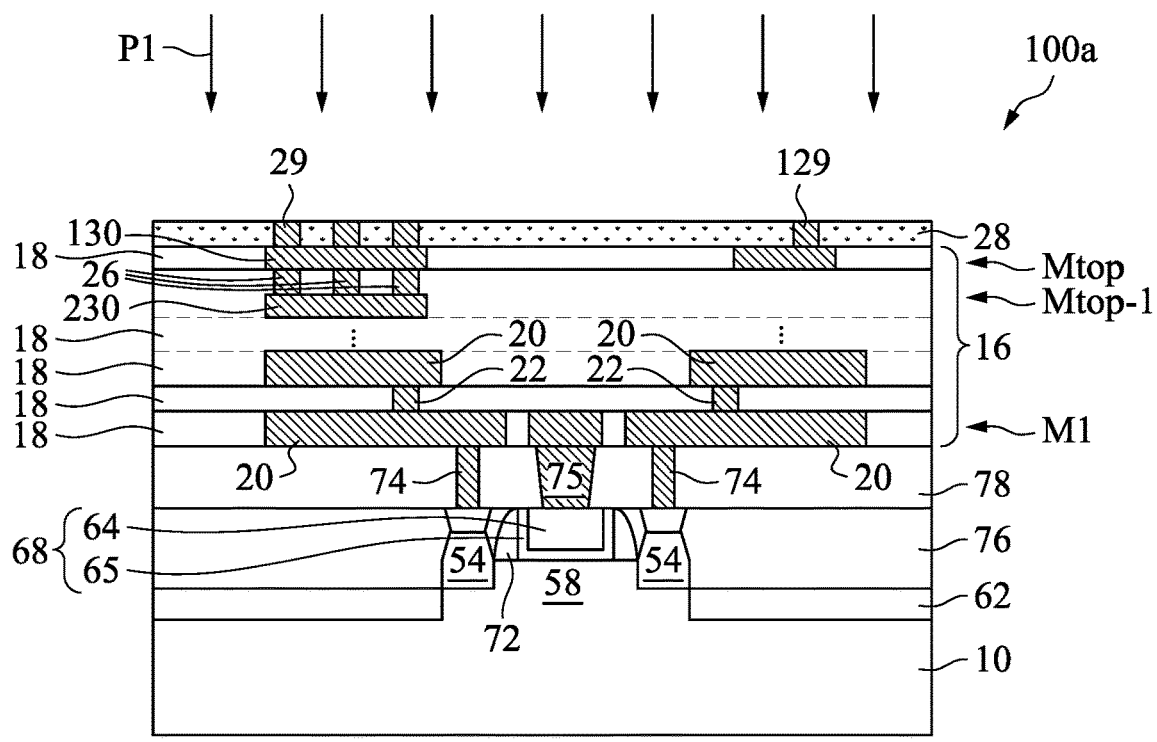

Referring back to FIG. 1, the method M then proceeds to block S102 where oxide formed on a top surface of the wafer is removed. With reference to FIG. 2B, in some embodiments of block S102, a plasma etching process P1 may, for example, remove the oxide layers 39 and 139 from the surface of the metal vias 29 and 129 before a metal deposition step shown in FIG. 2C so that the subsequently deposited metal can make good electrical contact with the underlying metal layer of the wafer 100a.

Figure 3A:
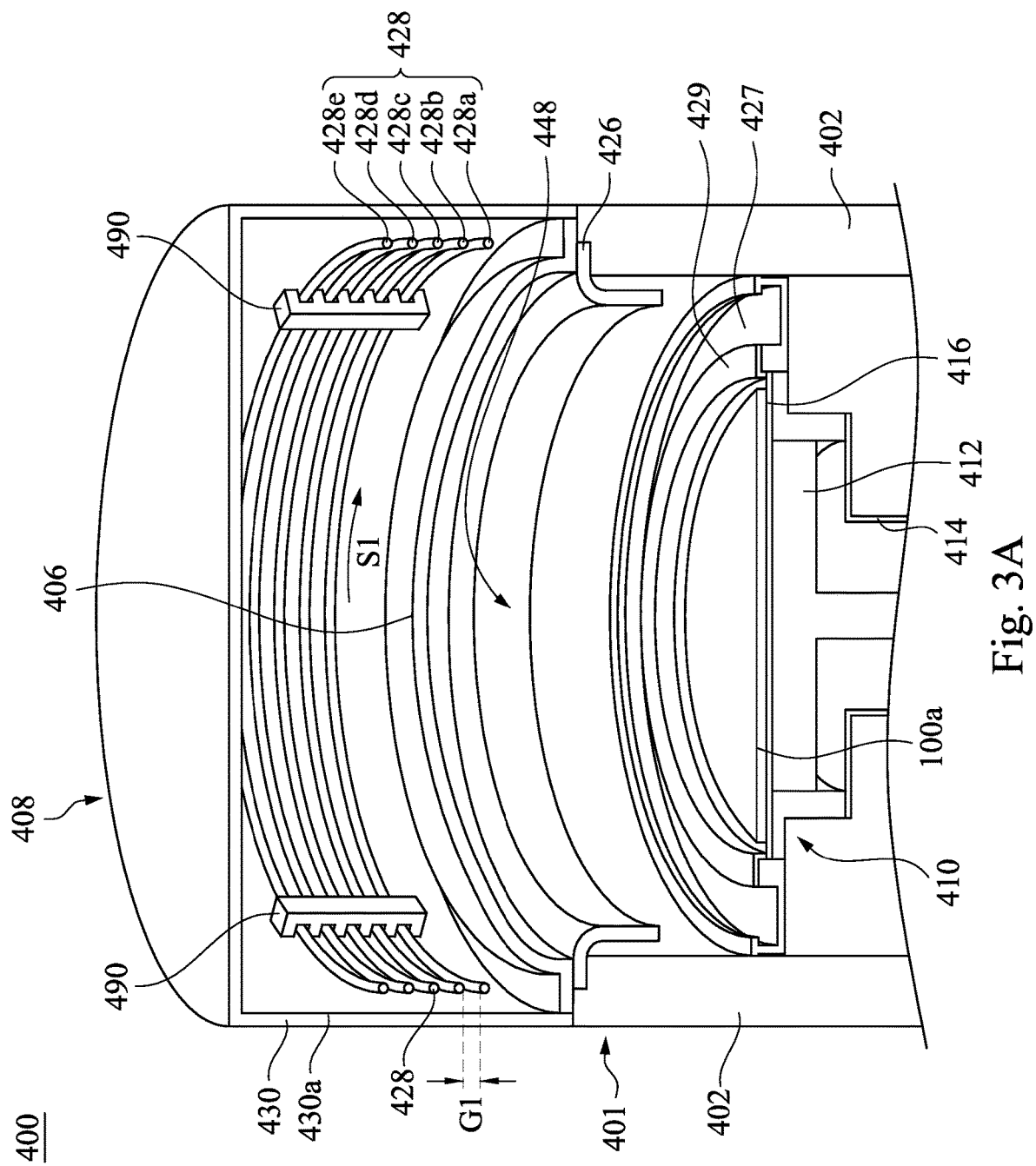
FIGS. 3A and 3B illustrate schematic views of a plasma processing tool in accordance with some embodiments of the present disclosure.
Figure 3B:
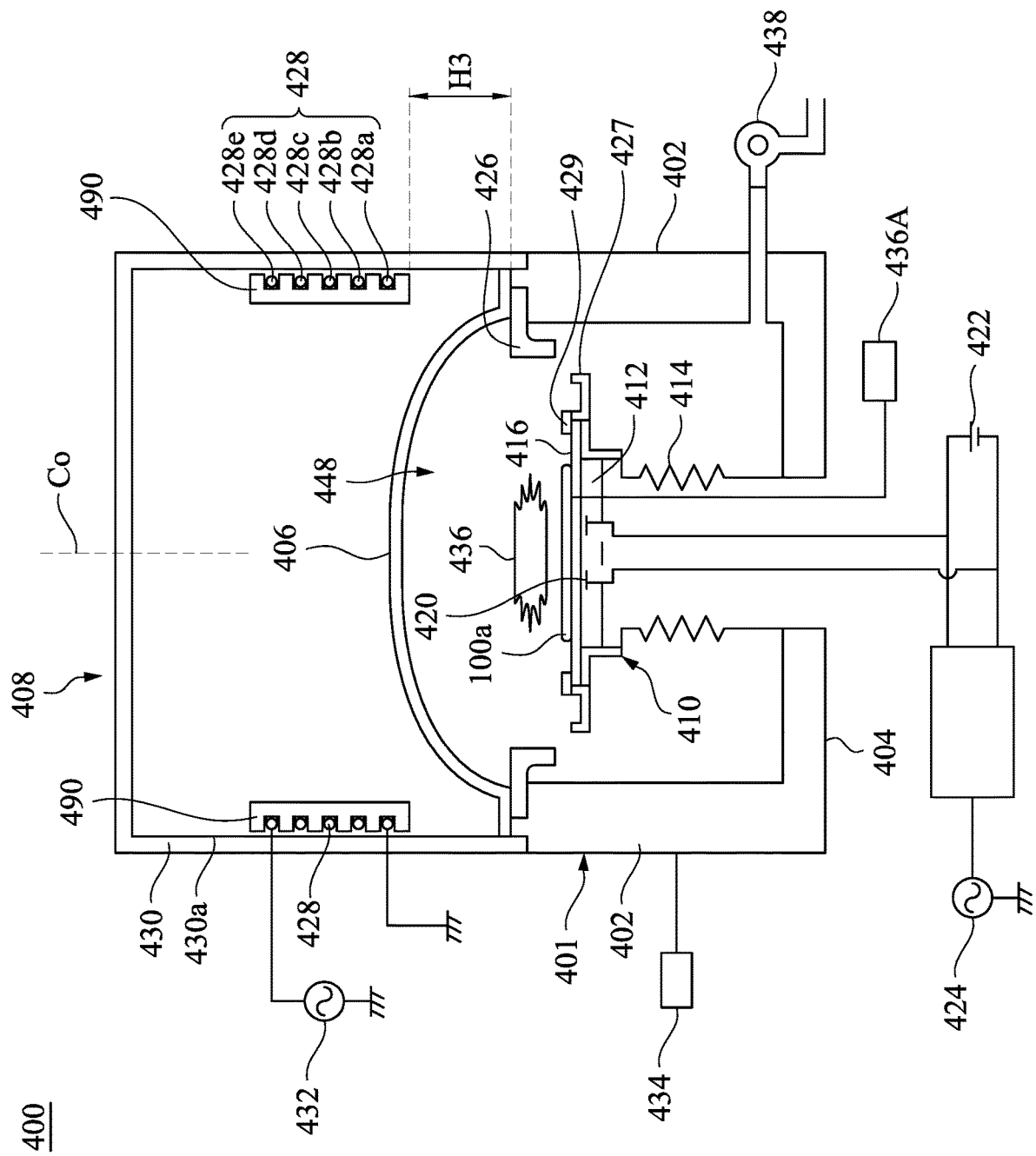

FIGS. 3A and 3B illustrate schematic views of a plasma processing tool 400 in accordance with some embodiments of the present disclosure to perform the plasma etching process P1 (see FIG. 2B) on the wafer 100a. In some embodiments, a RF coil 428 of the plasma processing tool 400 may be energized by an RF power source 432 and therefore generates an electrical field. Process gas (e.g., argon) is introduced into the chamber body 401 from a process gas source 434 (see FIG. 3B). The electric field causes dissociation of the process gas in a process cavity 448 of a chamber body 401 so to form plasma 436 (see FIG. 3B). The RF coil 428 allows control of the radial ion distribution and density in the chamber body 401 of the plasma processing tool 400, thereby improving plasma uniformity. The plasma density relates to the number of plasma species per unit volume of plasma, which is to be primarily a function of a RF power source 432 (see FIG. 3B). A higher plasma density, within limits, provides more plasma species for sputter etching. The RF power source 424 (see FIG. 3B) creates an electric field orthogonal to a surface of the wafer 100a that can accelerate plasma ions into and away from the surface of the wafer 100a. The ions sputter etch the surface of the wafer 100a by physically bombarding the surface of the wafer, which in turn allows for removing the oxide layers 39 and 139 as shown in FIG. 2A from the surface of the metal vias 29 and 129.

With reference to FIGS. 3A and 3B, the chamber body 401 of the plasma processing tool 400 may include a plurality of walls 402 upwardly extending from a base 404 (see FIG. 3B). The plasma processing tool 400 may further include a belljar 406 encloses the process cavity 448 of the chamber body 401. In some embodiments, the belljar 406 can be interchangeably referred to as a dome-shaped lid. In some embodiments, the belljar 406 may be made of quartz or silica glass. Within the process cavity 448, a substrate support 410 is disposed for supporting and retaining the wafer 100a. The substrate support 410 further comprises a pedestal 412 sheathed in a bellows assembly 414. The bellows assembly 414 allows for movement of the substrate support 410 within the process cavity 448 while maintaining a vacuum condition within the chamber body 401. An electrostatic chuck 416 is disposed on top of the pedestal 412 for retaining the wafer 100a thereupon. The wafer 100a is electrostatically retained by the electrostatic chuck by the one or more electrodes 420 (see FIG. 3B) connected to a chucking power supply 422 (e.g., a high-powered DC source). Additionally, the substrate support 410 functions as an RF cathode via connection to an RF power supply 424. The chamber body 401 may include one or more shields, cover rings or the like, such as an inner shield 426, a lower shield 427, and a cover ring 429 circumscribing various chamber components to prevent unwanted reaction between such components and ionized process material.

To create the desired plasma for processing the wafer 100a, the RF resonator 408 including the RF coil 428 is provided in the chamber body 401. Specifically, the RF coil 428 is disposed within a resonator housing 430 disposed above the belljar 406. The RF coil 428 is spiral-shaped and extends to spiral upwards above the belljar 406 along an inner sidewall 430a of the resonator housing 430. In other words, the RF coil 428 has a plurality of coil segments 428a, 428b, 428c, 428d, and 428e arranged along a direction in parallel to the inner sidewall 430a of the resonator housing 430 as shown in the cross section of FIG. 4B. Because the electrical field used to dissociate the process gas to form the plasma 436 is generated by the RF coil 428, the uniformity of the plasma 436 may be affected by the structure of the RF coil 428. For example, if adjacent two coil segments of the RF coil 428 have a variable gap therebetween, the RF coil 428 will cause an uneven distribution of the plasma 436 in the chamber body 401. The uneven distribution of the plasma 436 may cause different ions sputter etch rates on the different regions of the wafer 100a, such that the oxide layer on the metal vias may not be completely removed from the wafer 100a in some regions which in turn deteriorates electrical contact between the subsequently deposited metal and the underlying metal vias.

Therefore, the present disclosure in various embodiments provides a movable jig 490 in the RF resonator 408. The movable jig 490 is used to confine any adjacent two coil segments 428a-428e of the RF coil 428 in a fixed gap G1 along a spiral direction S1, before and/or during the plasma etching process P1 as shown in FIG. 2B. As a result, uniformity of the plasma 436 in the chamber body 401 can be increased, which in turn improves uniformity of sputter etch rates on different regions of the wafer 100a, such that the oxide layer on the vias may be completely removed from the wafer 100a to improve the electrical contact between the subsequently deposited metal and the underlying metal vias. In some embodiments, the gap G1 between adjacent two coil segments of the RF coil 428 can be interchangeably referred to as a distance between adjacent two coil segments of the RF coil 428.

Figure 4A:
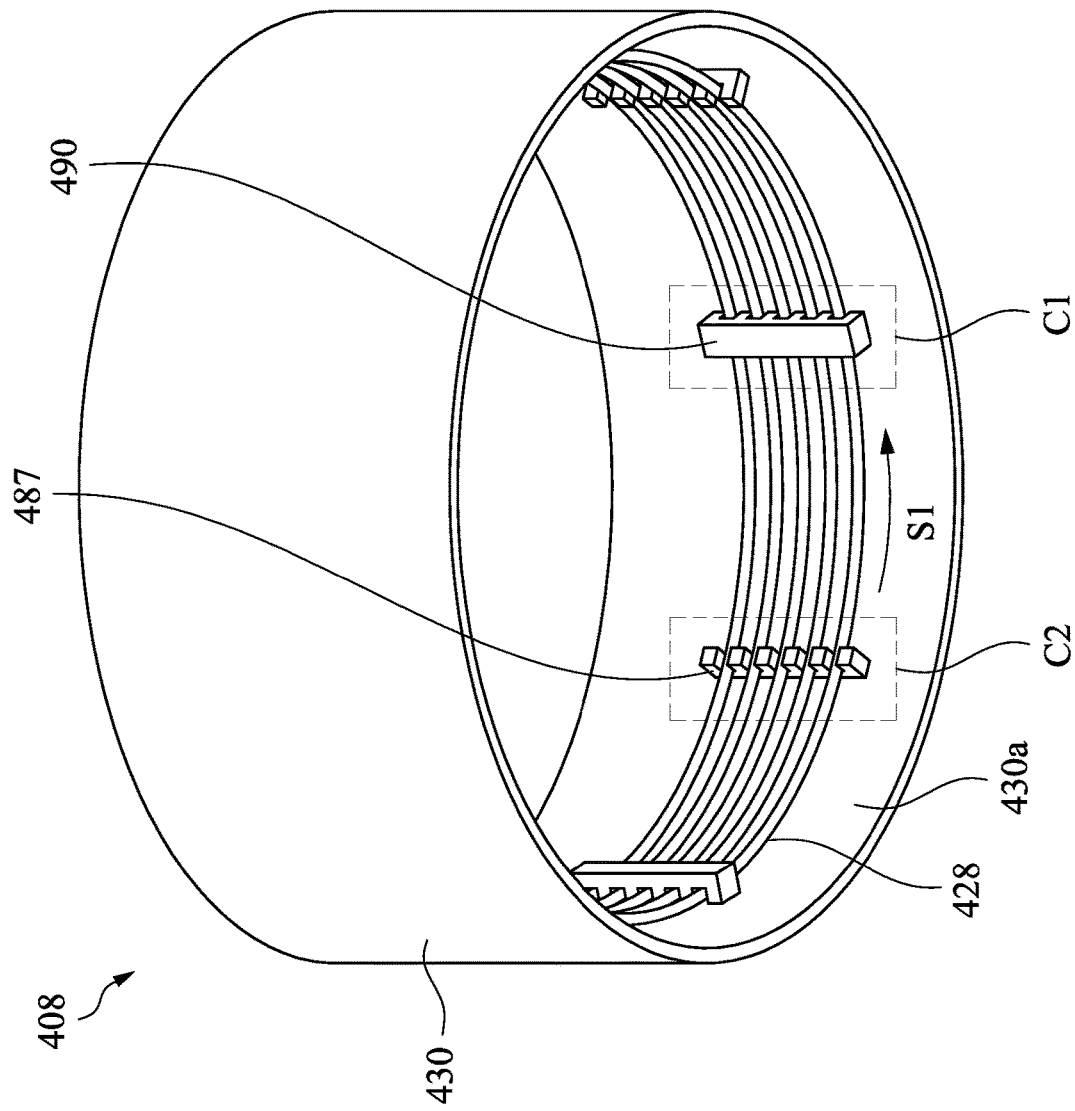
FIG. 4A illustrates a perspective view of a resonator of a plasma processing tool with a movable jig and a fixed jig in accordance with some embodiments of the present disclosure.
Figure 4B:
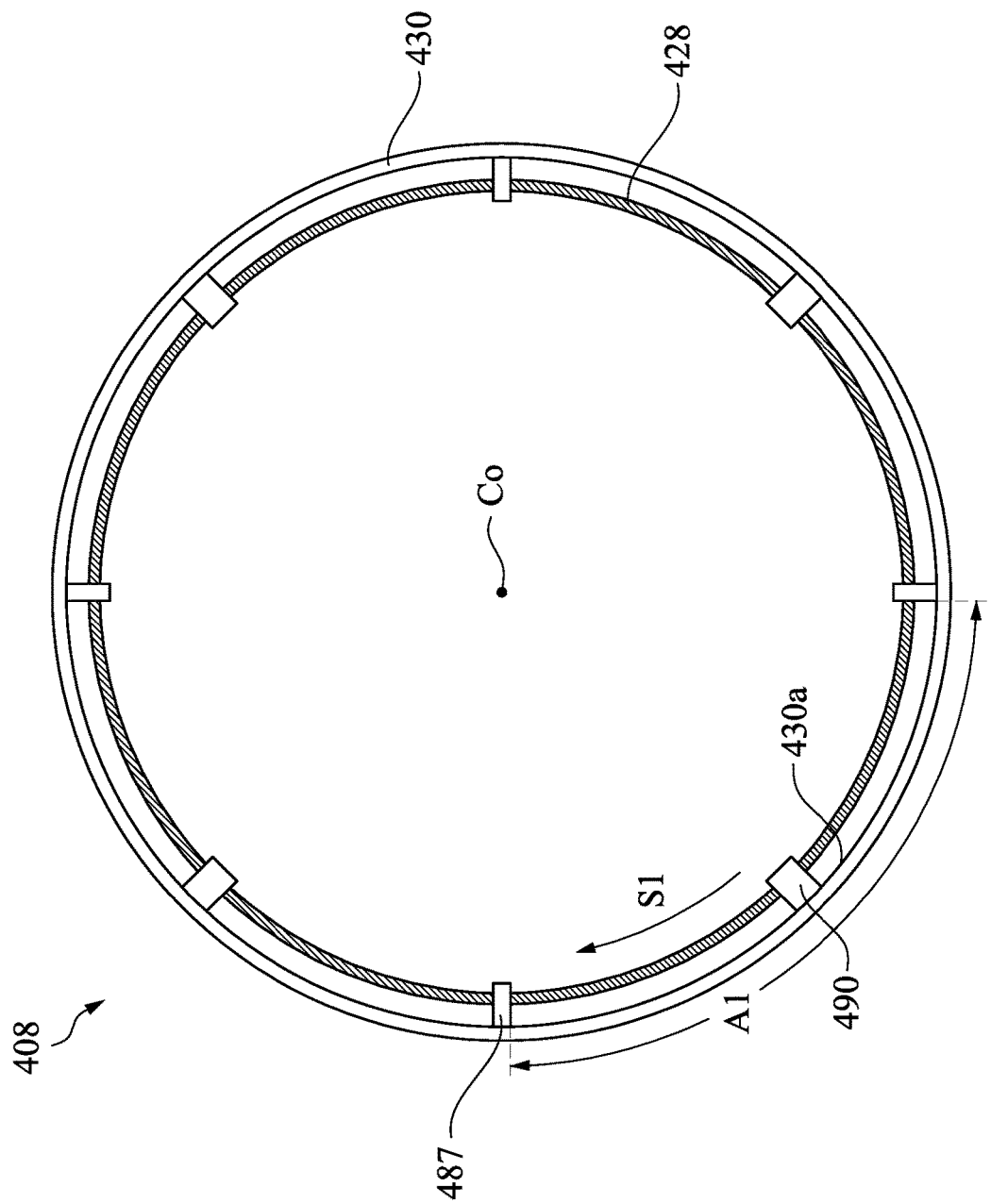
FIG. 4B illustrates a bottom-up view of a resonator of a plasma processing tool with a movable jig and a fixed jig in accordance with some embodiments of the present disclosure.
Figure 4C:
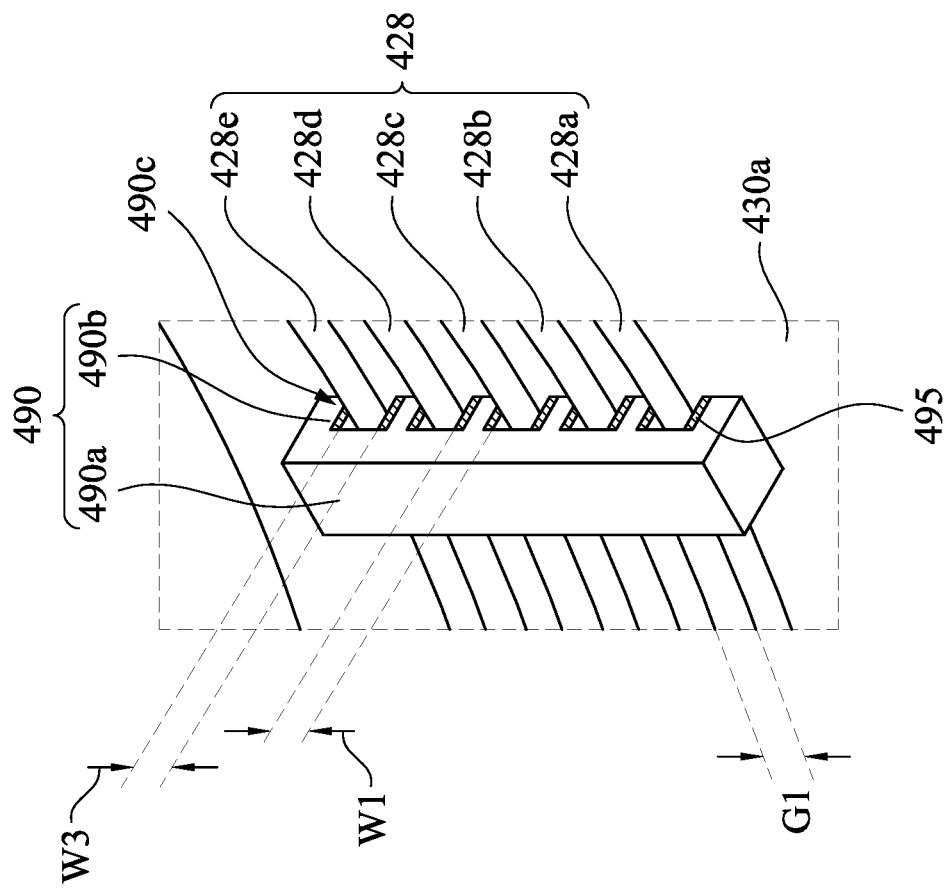
FIG. 4C illustrates a local enlarged view of the resonator of the plasma processing tool according to a region C1 in FIG. 4A.
Figure 4D:
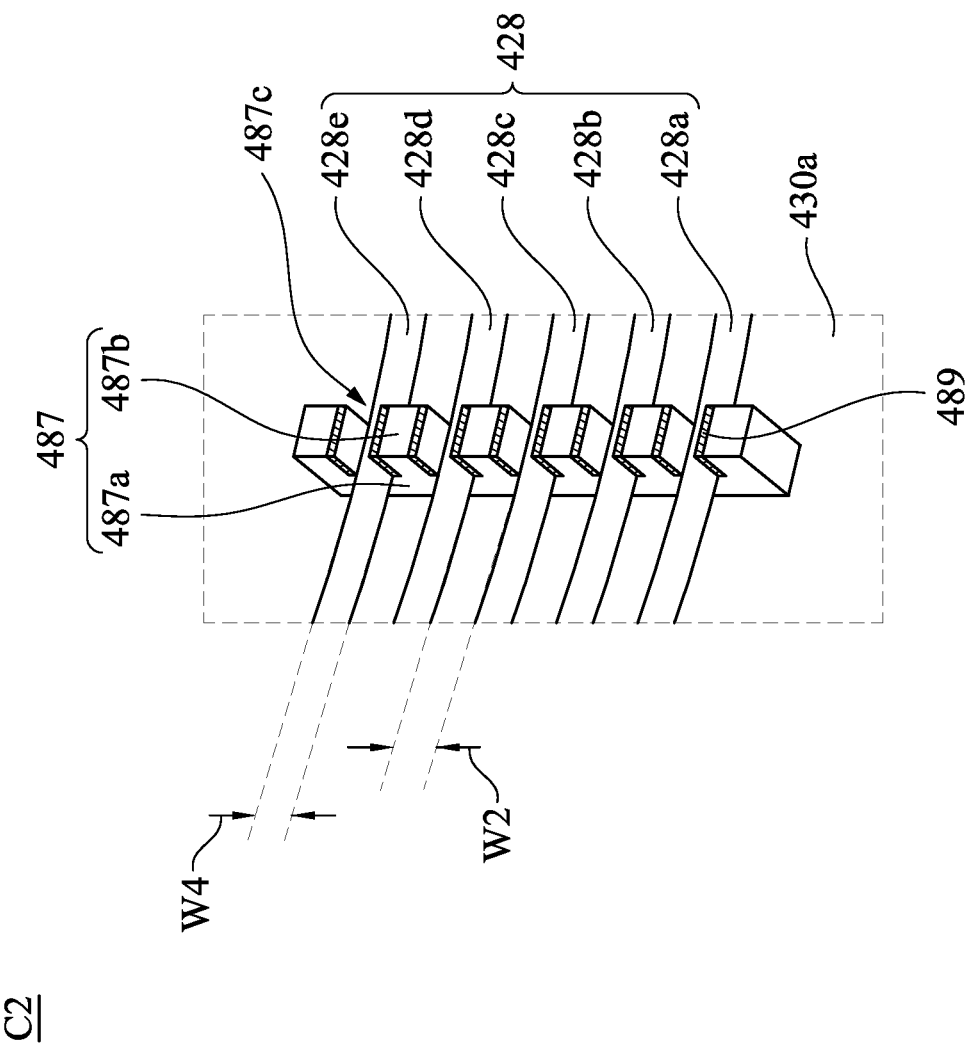
FIG. 4D illustrates a local enlarged view of the resonator of the plasma processing tool according to a region C2 in FIG. 4A.

Reference is made to FIGS. 4A, 4B, 4C, and 4D. FIG. 4A illustrates a perspective view of the resonator 408 of the plasma processing tool 400 with the movable jig 490 and a fixed jig 487 in accordance with some embodiments of the present disclosure. FIG. 4B illustrates a bottom-up view of the resonator 408 of the plasma processing tool 400 with the movable jig 490 and the fixed jig 487 in accordance with some embodiments of the present disclosure. FIG. 4C illustrates a local enlarged view of the resonator 408 in the plasma processing tool 400 according to a region C1 in FIG. 4A. FIG. 4D illustrates a local enlarged view of the resonator 408 of the plasma processing tool 400 according to a region C2 in FIG. 4A.

As shown in FIG. 4C, the movable jig 490 is in a shape of comb and thus has a bridge portion 490a and a plurality of confining legs 490b extending from the same side of the bridge portion 490a by the same leg length. Adjacent two of the confining legs 490b form a confining slot 490c therebetween. The movable jig 490 is movably mounted on the inner sidewall 430a of the resonator housing 430 and is operable to move along the inner sidewall 430a of the resonator housing 430 in a clockwise or counterclockwise direction. The RF coil 428 is fixed to the resonator housing 430 by a fixed jig 487 that is fixed to the inner sidewall of the resonator housing 430, as shown in FIGS. 4A and 4D. Each of the coil segments 428a, 428b, 428c, 428d, and 428e of the RF coil 428 passes through the confining slot 490c of the movable jig 490 as shown in FIG. 4C. In other words, adjacent two of the coil segments 428a, 428b, 428c, 428d, and 428e are vertically spaced apart from each other by the confining leg 490b of the movable jig 490 at a width W1 of the confining leg 490b.

As shown in FIGS. 4A-4C, the movable jig 490 is operable to horizontally move along the inner sidewall 430a of the resonator housing 430 in a predetermined arc length A1 (see FIG. 4B) to confirm adjacent two of the coil segments 428a, 428b, 428c, 428d, and 428e are vertically spaced apart from each other by the width W1 (see FIG. 4C) in the predetermined arc length A1. In some embodiments, the predetermined arc length A1 is substantially equal to an arc length between any adjacent two fixed jigs 487, the fixed jigs 487 used to hold the coil 428 kept stationary during the moving of the movable jig 490. In some embodiments, the predetermined arc length A1 is less than an arc length between any adjacent two fixed jigs 487. For example, if the adjacent two fixed jigs 487 is spaced apart from each other by a quarter of an inner circumference of the resonator housing 430, the movable jig 490 may be operable to horizontally travel the quarter or less than the quarter of the inner circumference of the resonator housing 430.

In some embodiments, the movable jig 490 may be operable to horizontally travel a radian along the inner sidewall 430a of the resonator housing 430 in a range from about 0 to about 360°. By way of example and not limitation, the movable jig 490 may be operable to horizontally travel a radian, such as about 20°, 40°, 60°, 80°, 90°, 120°, 140°, 160°, 180°, 200°, 220°, 240°, 260°, 280°, 300°, 320°, or 340°. In some embodiments, there is a plurality of the movable jig 490 movably mounted on the inner sidewall 430a of the resonator housing 430. By way of example and not limitation, the number of the movable jig 490 on the resonator housing 430 can be in a range from 1 to 12, such as 1, 2, 3, 4, 5, 6, 7, 8, 9, 10, 11, or 12. In some embodiments, the movable jig 490 may be made of an insulating material, such as polytetrafluoroethylene (PTFE) (also known as Teflon). In some embodiments, the movable jig 490 may be made of steel, stainless steel, nickel, aluminum, alloys of these, oxide of these, or combinations thereof, so as to withstand the high temperature in the manufacturing process.

As shown in FIG. 4C, the movable jig 490 further has pressure sensors 495 embedded therein. The pressure sensors 495 are on inner sidewalls of the confining leg 490b. During the processing of the plasma processing tool 400, the pressure sensors 495 detect the vertical movement of each coil segment of the spiral-shaped RF coil 428 from the stress induced by the coil segment, so as to determine whether the detected gap is abnormal. Once the movement of the coil segments forming the gap G1 is out of a predetermined range, the stress will trigger an alarm signal to the plasma processing tool 400 or a monitor system. By way of example and not limitation, when the pressure sensors 495 detect the gap G1 in a range from about 0 mm to 5 mm, the stress will trigger an alarm signal to the plasma processing tool 400, and then the plasma processing tool 400 will stop working (e.g., stop generating the plasma in the chamber body 401) immediately to avoid uneven distribution of the plasma in the chamber body 401. When the pressure sensors 495 detect the gap G1 in a range from about 5 mm to about 8 mm, the stress will trigger a warning to an alert operator, but not stop the working of the plasma processing tool 400.

For example, the pressure sensor 495 has a press detection function for measuring the pressure of external force applied to a surface (also referred to as a pressing force). In some embodiments, the pressure sensor 495 can be a resistive pressure sensor. The resistive pressure sensor converts the mechanical pressure value into a proportional electrical signal. The pressure sensor 495 may include a stable main body and a (thin) diaphragm. The diaphragm is equipped with strain-sensitive and compression-sensitive resistance structures, so-called strain gauges (DMS). The diaphragm is deflected under the influence of pressure. Thus, the strain gauges attached to it are elongated or compressed and its electrical resistance changes. This change in resistance is substantially proportional to the pressure. It is noted that other types of the pressure sensors can be applied to the movable jig 490.

In some embodiments, the pressure sensor 495 senses the pressure applied by each coil segment of the spiral-shaped RF coil 428, and this pressure may be referred as a predetermined pressure value. In some embodiments, when a coil segment of the spiral-shaped RF coil 428 moves a distance, the pressure sensor 495 will not sense the pressure, and the pressure sensed by the pressure sensor 495 is lower than the predetermined pressure value. In some embodiments, a coil segment of the spiral-shaped RF coil 428 be twisted to in a wrong position, the pressure sensor 495 will senses a pressure, which is beyond the predetermined pressure range (may be lower or higher than the predetermined pressure range). Hence, by sensing the pressures applied by the coil segment of the spiral-shaped RF coil 428 to the pressure sensor 495, the state of the coil segment of the spiral-shaped RF coil 428 can be determined.

As shown in FIGS. 4A and 4D, the RF coil 428 is fixed to the resonator housing 430 by the fixed jig 487. The fixed jig 487 is in a shape of comb and thus has a bridge portion 487a and a plurality of confining legs 487b extending from the same side of the bridge portion 487a by the same leg length. Adjacent two of the confining legs 487b form a confining slot 487c therebetween. The bridge portion 487a is fixed to the resonator housing 430, such that the confining legs 487b protrude towards the central axis $C_O$ (see FIG. 3B) of the resonator housing 430. Each of the coil segments 428a, 428b, 428c, 428d; and 428e of the RF coil 428 passes through the confining slot 487c of the fixed jig 487 as shown in FIG. 4D. In other words, adjacent two of the coil segments 428a, 428b, 428c, 428d, and 428e are vertically spaced apart from each other by the confining leg 487b of the fixed jig 487 at a width W2 of the confining leg 487b. As shown in FIG. 4D, in order to hold the RF coil 428 firmly, the fixed jig 487 further has rubbers 489 in each confining slot 487c, so that the RF coil can be fit in the rubbers 489 in an interference fit connections. The rubbers 489 are on inner sidewalls of the confining leg 487b. In some embodiments, the rubbers 489 may be other elastic material. In some embodiments, the confining slot 487c of the fixed jig 487 has a width W4 less than a width W3 (see FIG. 4C) of the confining slot 490c of the movable jig 490. In other words, the width W2 of the confining leg 487b of the fixed jig 487 may be greater than the width W1 (see FIG. 4C) of the confining leg 490b of the movable jig 490. Therefore, the fixed jig 487 can clamp the RF coil 428 to prevent the RF coil 428 from shaking during the moving of the movable jig 490.

Reference is made to FIGS. 5A-5C. FIGS. 5A-5C illustrate perspective, top, and side views of a movable jig 590 in accordance with some embodiments of the present disclosure. Structure and operations of the movable jig 590 are substantially the same as the structure and operations of the movable jig 490 described in foregoing descriptions and thus are not repeated herein for the sake of clarity. For example, structure related to a bridge portion 590a and a confining leg 590b of the movable jig 590 may be substantially the same as those of the bridge portion 490a and the confining leg 490b of the movable jig 490 as shown in FIGS. 4A and 4C. Therefore, reference may be made to the foregoing paragraphs for the related detailed descriptions, and are not described again herein.

The difference between the present embodiment and the embodiment in FIGS. 4A and 4C is that the movable jig 590 further including a handle 590c fixed to the bridge portion 590a at a side of the bridge portion 590a opposite to the confining leg 590b. An opening 590d is formed through the movable jig 590 and between the bridge portion 590a and the handle 590c. In some embodiments, the handle 590c with the opening 590d may allow the staff to manually operate the movable jig 590 when maintaining a plasma processing tool. This is described in greater detail with reference to FIGS. 5B and 5C, the movable jig 590 may have a dimension H1 (see FIG. 5B) along Y-direction in a range from about 40 mm to about 60 mm and a thickness T1 (see FIG. 5C) along Z-direction in a range from about 10 mm to about 30 mm, by way of example and not limitation. For example, the dimension H1 may be 40, 42, 44, 46, 48, 50, 52, 54, 56, 58, or 60 mm, and the thickness T1 may be 10, 12, 14, 16, 18, 20, 22, 24, 26, 28, or 30 mm. In some embodiments, the opening 590d of the movable jig 590 may have a dimension D1 (see FIG. 5B) along X-direction in a range from about 60 mm to about 80 mm and a dimension D2 (see FIG. 5B) along Y-direction in a range from about 10 mm to about 30 mm. For example, the dimension D1 may be 60, 62, 64, 66, 68, 68.4, 70, 72, 74, 76, 78, or 80 mm, and the dimension D2 may be 10, 12, 14, 16, 18, 20, 22, 24, 26, 28, or 30 mm. In some embodiments, the handle 590c of the movable jig 590 may have a dimension L1 (see FIG. 5C) along X-direction in a range from about 80 mm to about 100 mm. For example, the dimension L1 may be 80, 82, 84, 86, 88, 88.4, 90, 92, 94, 96, 98, or 100 mm. In some embodiments, the confining leg 590b of the movable jig 590 may have the width W1 along X-direction in a range from about 10 mm to about 14 mm and a length H2 along Y-direction in a range from about 8 mm to about 12 mm. For example, the width W1 may be 10, 11, 12, 13, or 14 mm, and the length H2 may be 8, 9, 10, 11, or 12 mm.

Figure 6B:
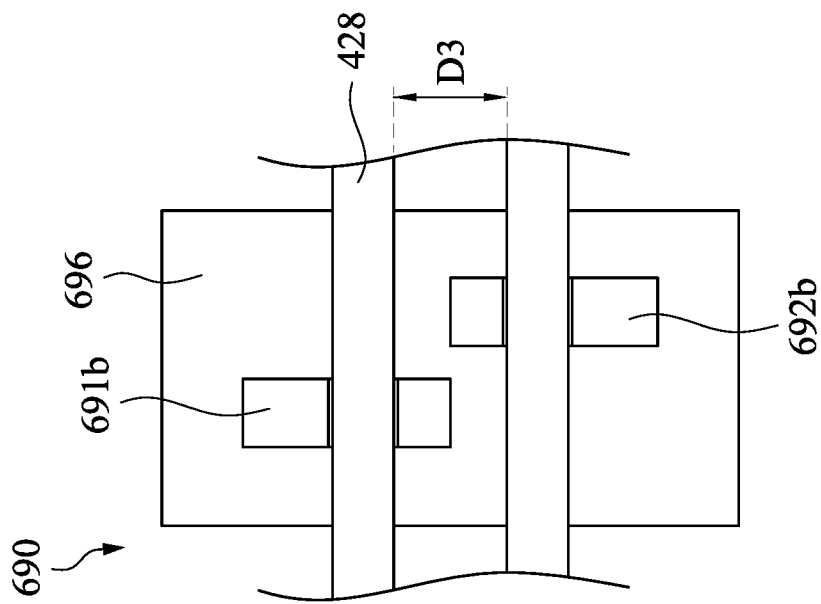
FIGS. 6B, 7B, and 8B illustrate side views of the movable jig at different operations according to FIGS. 6A, 7A, and 8A.
Figure 6A:
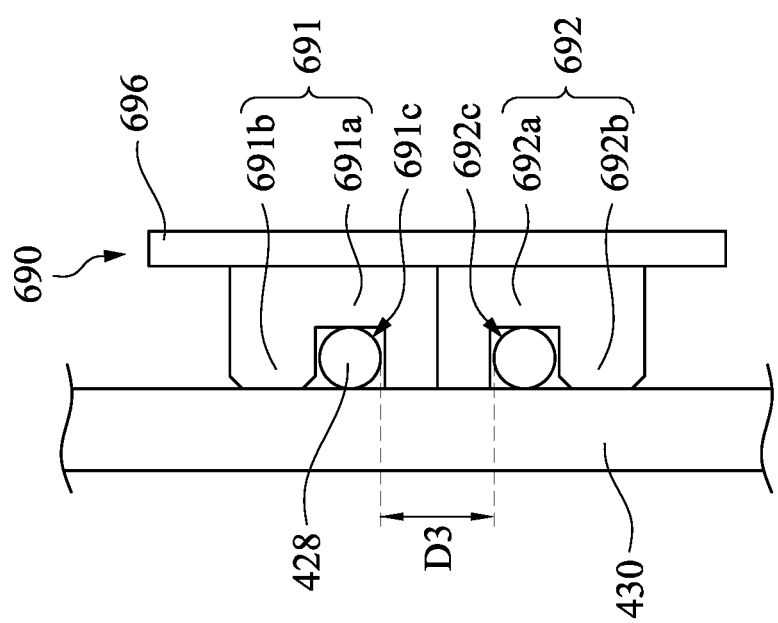
FIGS. 6A, 7A, and 8A illustrate a movable jig in a resonator of a plasma processing tool at different operations in accordance with some embodiments of the present disclosure.
Figure 7B:
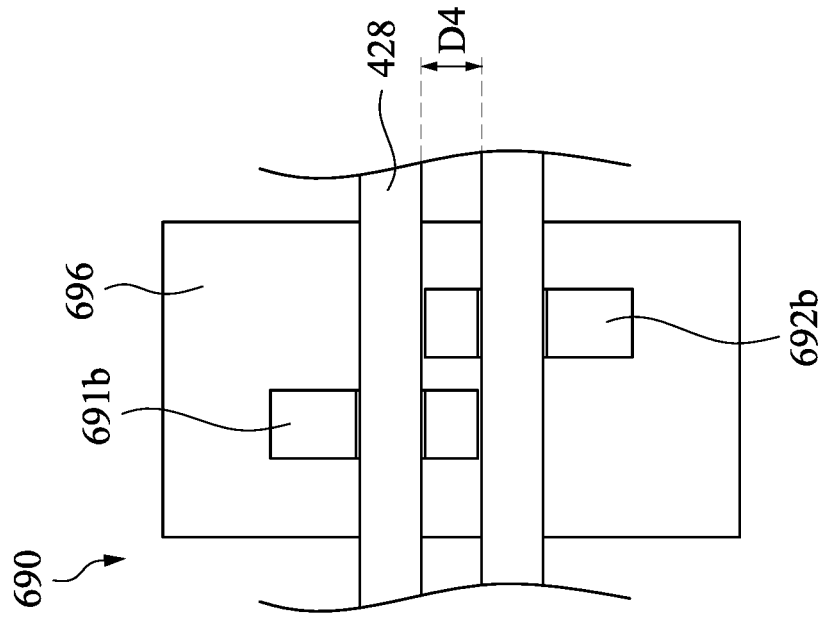
Figure 7A:
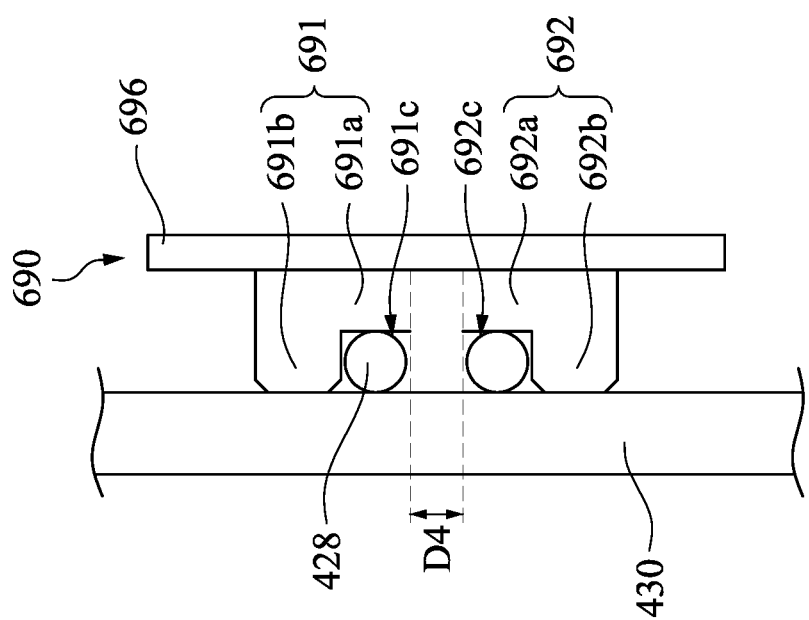
Figure 8B:
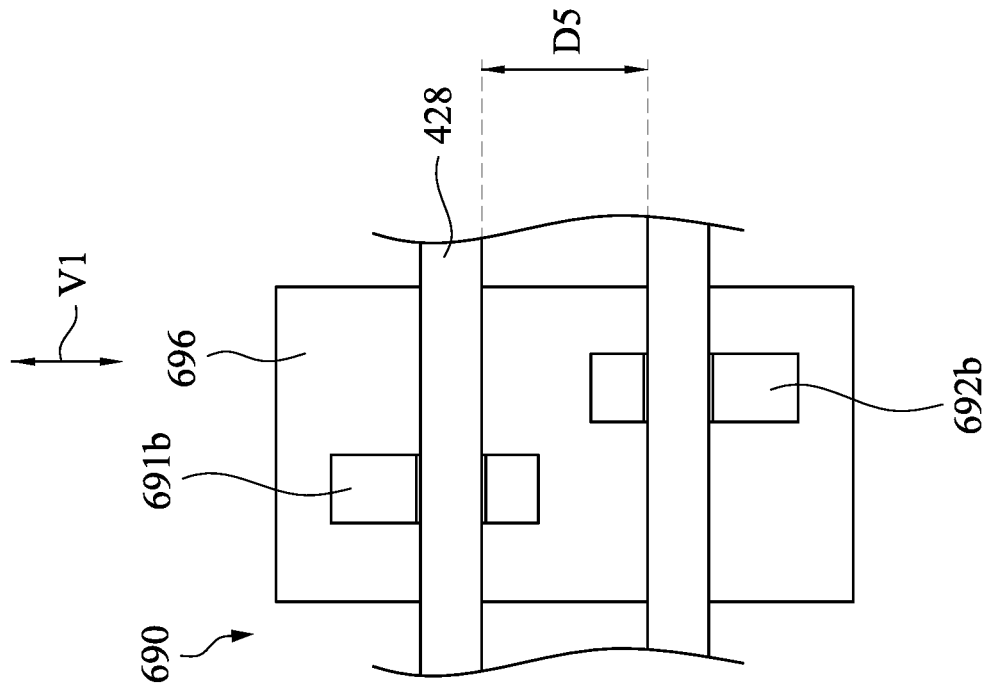

Reference is made to FIGS. 6A-8B. FIGS. 6A, 7A, and 8A illustrate a movable jig 690 in a resonator of a plasma processing tool at different operations in accordance with some embodiments of the present disclosure. FIGS. 6B, 7B, and 8B illustrate side views of the movable jig 690 at different operations according to FIGS. 6A, 7A, and 8A. Structure and operations of the movable jig 690 are substantially the same as the structure and operations of the movable jig 490 described in foregoing descriptions and thus are not repeated herein for the sake of clarity. For example, structure related to bridge portions 691a and 692a of the and confining legs 691b and 692b of the movable jig 690 may be substantially the same as those of the bridge portion 490a and the confining leg 490b of the movable jig 490 as shown in FIGS. 4A and 4C. Therefore, reference may be made to the foregoing paragraphs for the related detailed descriptions, and are not described again herein. In some embodiments, the bridge portion 691a and the and the confining leg 691b can be collectively referred to as a confining structure 691 (see FIGS. 6A, 7A, and 8A) and the bridge portion 692a and the confining leg 692b can be collectively referred to as a confining structure 692 (see FIGS. 6A, 7A, and 8A).

The difference between the present embodiment and the embodiment in FIGS. 4A and 4B is that the movable jig 690 further includes a traveling plate 696. The traveling plate 696 is movably mounted on the inner sidewall 430a of the resonator housing 430 (see FIGS. 6A, 7A, and 8A) and is operable to horizontally move along the inner sidewall 430a of the resonator housing 430 as shown in FIG. 4A. The bridge portions 691a and 692a are movably mounted on the traveling plate 696 and are misaligned along a vertical direction V1 parallel with the inner sidewall 430a of the resonator housing 430. Specifically, the bridge portions 691a is linearly movable along the vertical direction V1 parallel with the inner sidewall 430a of the resonator housing 430, the bridge portions 691b is also linearly movable along the vertical direction V1 parallel with the inner sidewall 430a of the resonator housing 430, and a range of motion of the bridge portions 691a along the vertical direction V1 is independent of a range of motion of the bridge portions 691b along the vertical direction V1. In some embodiments, there is a plurality of the movable jig 690 movably mounted on the inner sidewall 430a of the resonator housing 430. By way of example and not limitation, the number of the movable jig 690 on the resonator housing 630 can be in a range from 1 to 12, such as 1, 2, 3, 4, 5, 6, 7, 8, 9, 10, 11, or 12.

Figure 8A:
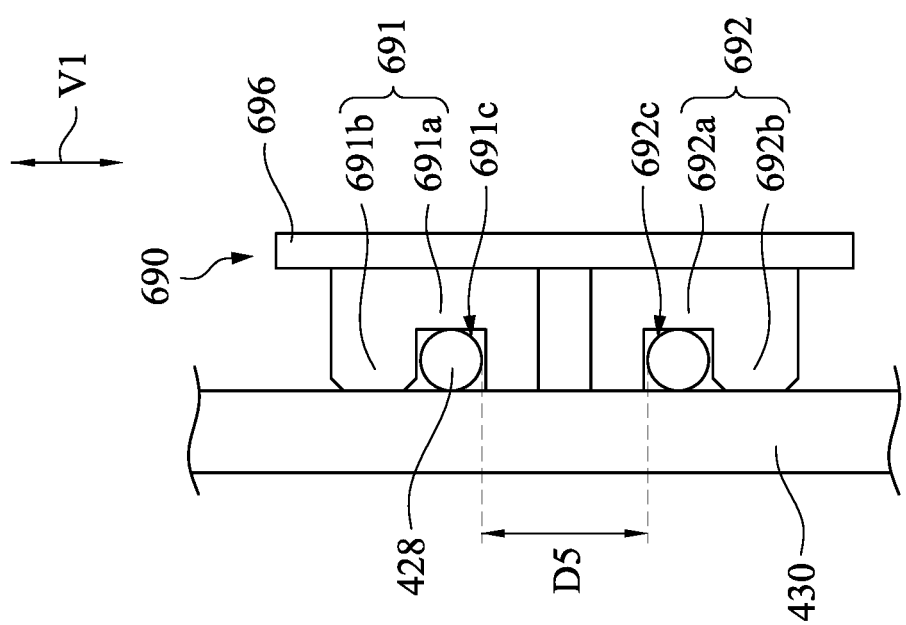

As shown in FIGS. 6A, 7A, and 8A, each of the bridge portions 691a and 692a has a pair of confining legs 691b or 692b protruding therefrom, and the pair of confining legs 691b or 692b form a confining slot 691c or 692c therebetween. The coil segments of the RF coil 428 can pass through the confining slots 691c and 692c of the movable jig 690. Adjacent two of the coil segments of the RF coil 428 are vertically spaced apart from each other by the ranges of motions of the bridge portions 691a and 692a on the traveling plate 696. Therefore, the movable jig 690 allows control the gap of the adjacent coil segments of the RF coil 428 by the separated bridge portions 691a and 692a on the traveling plate 696. Different gaps of the adjacent coil segments of the RF coil 428 may create different electric fields in the chamber body 401 as shown in FIGS. 3A and 3B to dissociate of the process gas in the chamber body 401 to form plasma 436, and thus the RF coil 428 may allow control of the radial ion density in the chamber body 401, which in turn allows for adjusting the plasma density in the chamber body 401. In some embodiments, different plasma densities may depend on different plasma species for sputter etching and may cause different ions sputter etch rates in need.

In addition, the movable jig 690 is operable to horizontally move along the inner sidewall 430a of the resonator housing 430 in a clockwise or counterclockwise direction, by the traveling plate 696. Movement of the movable jig 690 is set in a predetermined arc length by program to confirm adjacent two of the coil segments of the RF coil 428 in the confining slots 691c and 692c are vertically spaced apart from each other by an acceptable gap.

Reference is made to FIGS. 6A, 6B, 7A, and 7B. The coil segments of the RF coil 428 shown in FIGS. 6A and 6B are spaced apart from each other by a gap D3. In some embodiments, the gap D3 may be in a range from about 8 mm to about 16 mm, such as about 8, 9, 10, 11, 12, 13, 14, 15, or 16 mm. Subsequently, the bridge portions 691a and 692a of the movable jig 690 may move toward each other in the vertical direction V1 as shown in FIGS. 7A and 7B, such that a gap between the coil segments of the RF coil 428 is gradually decreased to the gap D4 with the movement of the bridge portions 691a and 692a relative to the traveling plate 696. In some embodiments, the gap D4 may be in a range from about 3 mm to about 8 mm, such as about 3, 4, 5, 6, or 7 mm. By way of example and not limitation, the gap D4 of the adjacent coil segments of the RF coil 428 may create a higher plasma density in the chamber body 401 than the gap D3 which in turn increases ions sputter etch rate on another processing wafer than the wafer 100a as shown in FIG. 2B. In some embodiments, the gap D4 of the RF coil 428 at the movable jig 690 may be less than the gap G1 of the RF coil 428 at the fixed jig 487 as shown in FIG. 4D (e.g., the width W2). Therefore, the RF coil 428 can control the radial ion density in the chamber body 401 at different angles, which in turn allows for adjusting the plasma density in the chamber body 401 for a wafer.

Reference is made to FIGS. 6A, 6B, 8A, and 8B. The bridge portions 691a and 692a of the movable jig 690 may move away from each other in the vertical direction V1 as shown in FIGS. 8A and 8B, such that a gap between the coil segments of the RF coil 428 is gradually increased to the gap D5 with the movement of the bridge portions 691a and 692a relative to the traveling plate 696. In some embodiments, the gap D5 may be in a range from about 17 mm to about 22 mm, such as about 17, 18, 19, 20, 21, or 22 mm. By way of example and not limitation, the gap D5 of the adjacent coil segments of the RF coil 428 may create a lower plasma density in the chamber body 401 than the gap D3 which in turn decreases ions sputter etch rate on another processing wafer.

In some embodiments, bridge portions of the movable jig 690 set on lower coil segments of the RF coil 428 may move toward each other and other bridge portions of the movable jig 690 set on upper coil segments of the RF coil 428 move away from each other, such that a gap between the lower coil segments of the RF coil 428 may have a narrower gap than the upper coil segments of the RF coil 428, which in turn achieves a desired plasma distribution in the chamber body 401 to improve the plasma uniformity. In some embodiments, bridge portions of the movable jig 690 set on lower coil segments of the RF coil 428 may move away from each other and other bridge portions of the movable jig 690 set on upper coil segments of the RF coil 428 move toward each other, such that a gap between the lower coil segments of the RF coil 428 may have a wider gap than the upper coil segments of the RF coil 428, which in turn achieves a desired plasma distribution in the chamber body 401 to improve the plasma uniformity. In some embodiments, the gap D5 of the RF coil 428 at the movable jig 690 may be greater than the gap G1 of the RF coil 428 at the fixed jig 487 as shown in FIG. 4D (e.g., the width W2). Therefore, the RF coil 428 can control the radial ion density in the chamber body 401 at different angles, which in turn allows for adjusting the plasma density in the chamber body 401 for a wafer.

In some embodiments, the size of the gap between adjacent two coil segments of the spiral-shaped RF coil 428 may be adjusted according to the power or the frequency of the RF power source 432 supplied to the RF coil 428 to improve the plasma uniformity. By way of example and not limitation, when the power supplied to the RF coil 428 becomes larger, the gap between adjacent two coil segments of the spiral-shaped RF coil 428 will be adjusted to become smaller. In some embodiments, when the power supplied to the RF coil 428 becomes larger, the gap between adjacent two coil segments of the spiral-shaped RF coil 428 will be adjusted to become larger. By way of example and not limitation, when the frequency supplied to the RF coil 428 becomes larger, the gap between adjacent two coil segments of the spiral-shaped RF coil 428 will be adjusted to become smaller. In some embodiments, when the frequency supplied to the RF coil 428 becomes larger, the gap between adjacent two coil segments of the spiral-shaped RF coil 428 will be adjusted to become larger.

In some embodiments, approximately 10 to 1500 watts of power at a frequency of approximately 1 to 20 MHz may be supplied to the RF coil 428, and approximately 20-60 watts of power at a frequency of approximately 13.56 MHz may be supplied to the wafer 100a. The RF power source 432 may help to strike the plasma 436 within the chamber body 401, and the 13.56 MHz supply may generate a bias voltage and directs ions from the plasma 436 directly toward the wafer 100a for sputter etching of the oxide layers 39 and 139 formed above the wafer 100a. The process may be carried out with the chamber body 401 at a pressure ranging from approximately 2-20 MTorr. In some embodiments, the process is performed at a pressure ranging from approximately 2-20 Mtorr, and argon is supplied to the chamber body 401 at a flow rate of approximately 2-10 sccm.

In some embodiments, a backside gas is also provided through the substrate support 410 to a backside of the wafer 100a via a backside gas source 436A. The backside gas acts as a thermal conduction medium between the substrate support 410 and the wafer 100a. To establish and maintain the necessary environmental conditions in the chamber body 401, a pressure control device 438 is connected to the chamber body 401. The pressure control device is, for example, a turbo pump or other similar pump capable of establishing near vacuum conditions (i.e., chamber pressure in the mTorr range).

Referring back to FIG. 1, the method M then proceeds to block S103 where metal pads are formed over the wafer.

Figure 2C:
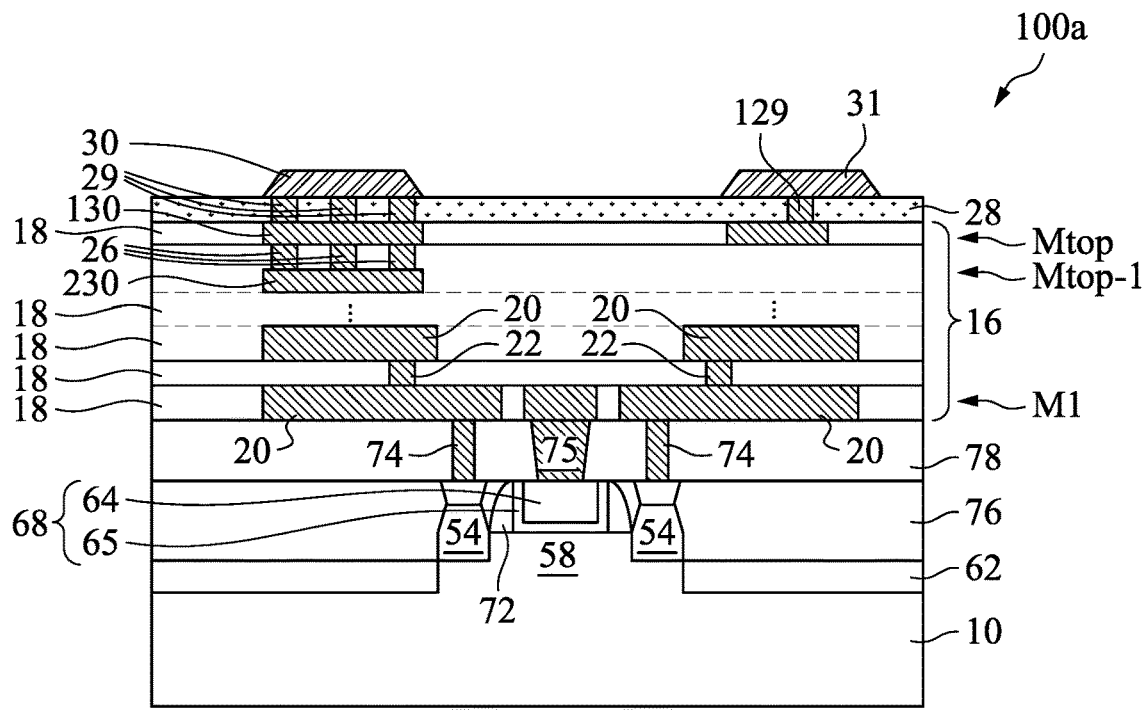
Figure 9:
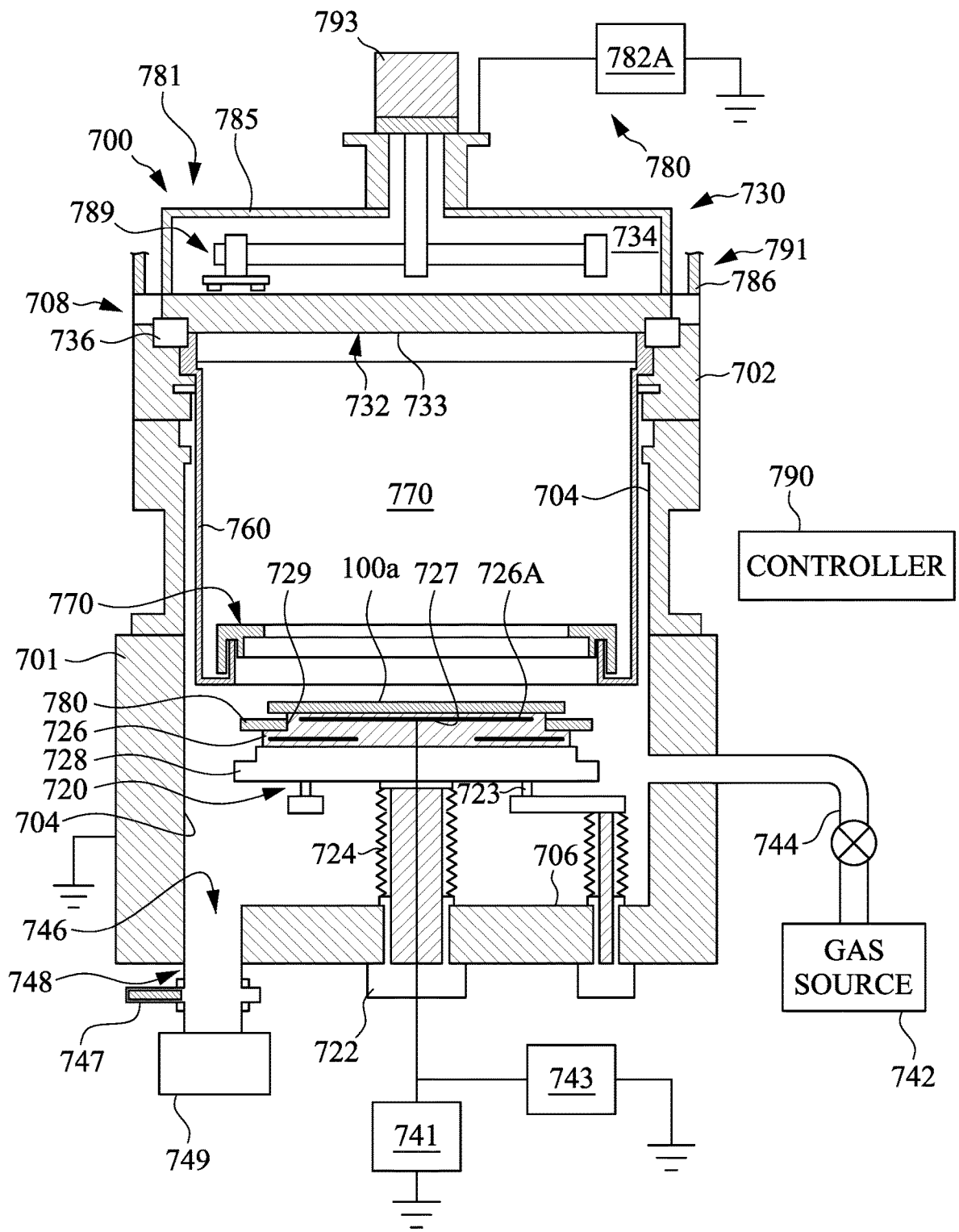
FIG. 9 illustrates a cross-sectional view of a semiconductor processing tool in accordance with some embodiments of the present disclosure.

With reference to FIG. 2C, in some embodiments of block S103, metal pads 30 and 31 are formed over the passivation layer 28 through a semiconductor processing tool 700 as shown in FIG. 9, and may be electrically coupled to the integrated circuit devices 12 through the metal lines 20 and metal vias 22. The metal pads 30 and 31 may be aluminum pads or aluminum-copper pads, and hence are alternatively referred to as aluminum pads 30 and 31 hereinafter, although other metallic materials may be used. Furthermore, the aluminum pad 30 may have a top-view size and a top-view shape similar to the top view sizes and the top-view shapes, respectively, of the metal pads 130 and 230.

Figure 10:
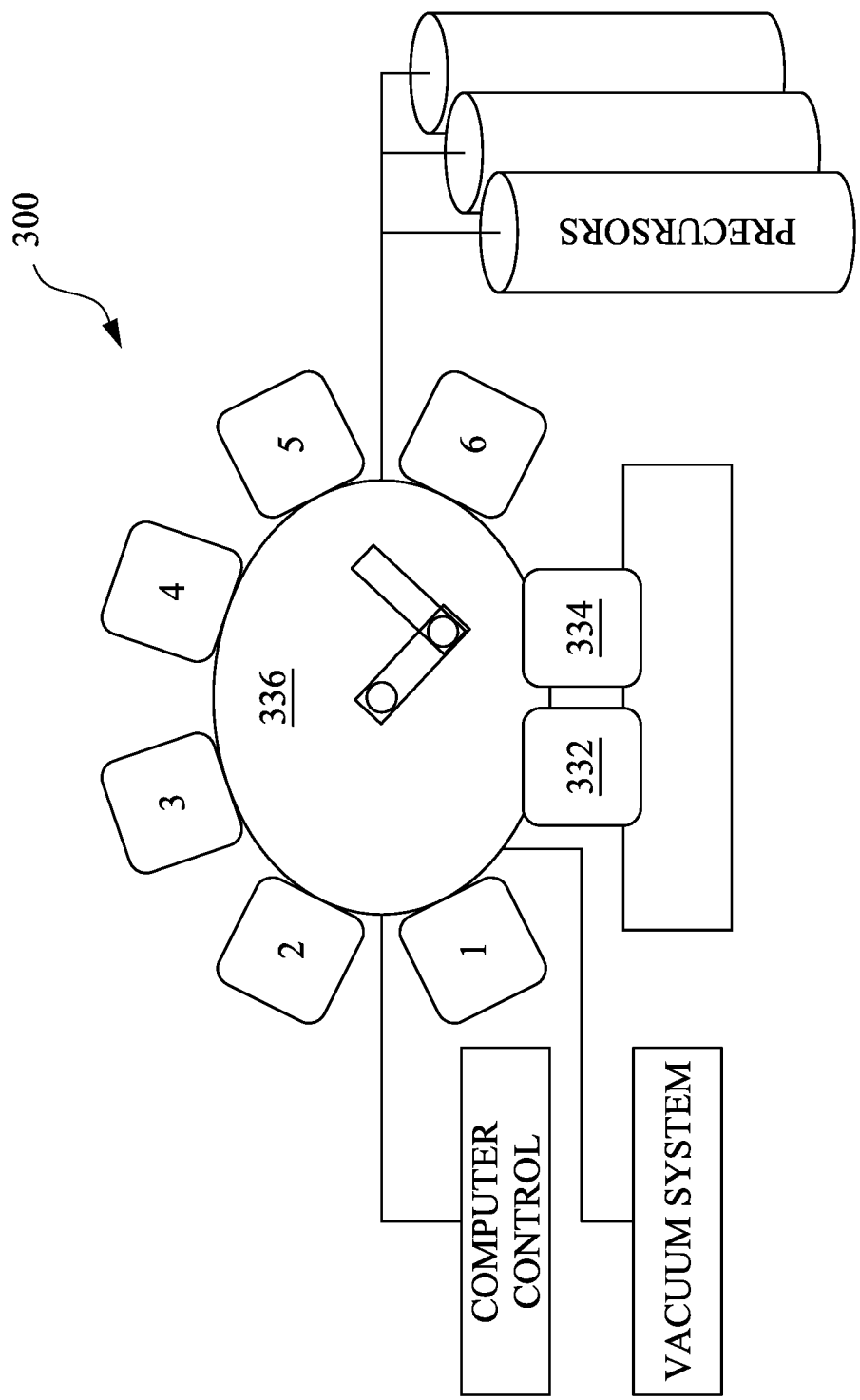
FIG. 10 illustrate a simplified diagram of a cluster tool having multiple single wafer processing clambers mounted thereon in accordance with some embodiments of the present disclosure.

In some embodiments, the semiconductor processing tool 700 shown in FIG. 9 and the plasma processing tool 400 shown in FIGS. 4A and 4C are processing chambers of the system 300 of FIG. 10. FIG. 10 illustrates a schematic top-view diagram of an exemplary multi-chamber processing system 300. In some embodiments, the system 300 may be equivalently referred to as a "cluster tool". Therefore, after the removing of the oxide layer 39 and 139 from the metal vias 29 and 129, the wafer 100a may be transferred from the plasma processing tool 400 shown in FIGS. 4A and 4C to a wafer handling chamber 336 (may also referred to as a non-process chamber) shown in FIG. 10. Subsequently, the wafer 100a may be transferred from the wafer handling chamber 336 to the semiconductor processing tool 700 shown in FIG. 9 to form the metal pads 30 and 31 on the metal vias 29 and 129. Because the wafer handling chamber 336 has a low pressure, e.g., <10 Torr, it is only minimally to form oxide on the metal vias 29 and 129 during the transferring, which in turn allows for improving the electrical contact between the metal pads 130 and 230 and the underlying metal vias 29 and 129.

In FIG. 10, the system 300 may generally include load lock chambers 332 and 334, the wafer handling chamber 336, and a plurality of processing system 1-6. In various embodiments, the load lock chambers 332 and 334 provide for the transfer of the wafer 100a into and out of the system 300. In various embodiments, the system 300 is under vacuum, and the load lock chambers 332 and 334 may "pump down" the substrates introduced into the system 300 (e.g., by way of a mechanical pump and/or a turbomolecular pump). In some embodiments, the load lock chambers 332 and 334 may be adapted to receive a single wafer or a plurality of wafers (e.g., loaded into a cassette). By way of example, the load lock chambers 332 and 334 may be separated from the wafer handling chamber 336 by way of a gate valve, allowing the wafer handling chamber 336 to remain under vacuum when one or both of the load lock chambers 332 and 334 are vented.

In various embodiments, the wafer handling chamber 336 is equipped with an automated, robotic arm that may move smoothly along any of a horizontal, vertical, and/or rotational axis so as to transfer substrates between the load lock chambers 332 and 334 and any of the substrate processing chambers 1-6. Each processing chamber 1-6 may be configured to perform a number of substrate processing operations such as atomic layer deposition (ALD), HDPCVD, PVD, etching, pre-treatment/pre-soak, de-gassing, annealing, as well as a number of metrology operations such as XPS analysis, AFM analysis, and/or other suitable processing or metrology operations. In various embodiments, the system 300 may have more or less processing chambers, for example, for a particular process to be performed by the system 300.

In FIG. 9, the semiconductor processing tool 700 which is performed to formed the metal pads 130 and 230. The semiconductor processing tool 700 has a process kit 750 capable of processing the wafer 100a. The process kit 750 includes at least a deposition ring 780 supported on a pedestal assembly 720, and may also include a one-piece ground shield 760 and an interleaving cover ring 770. In the version shown, the processing chamber 700 comprises a sputtering chamber, also called a physical vapor deposition or PVD chamber, capable of depositing metal or ceramic materials, such as for example, titanium, aluminum oxide, aluminum, copper, tantalum, tantalum nitride, tantalum carbide, tungsten, tungsten nitride, lanthanum, lanthanum oxides, titanium nitride, nickel, and NiPt, among others.

The processing chamber 700 includes a chamber body 701 having upper adapters 702 and lower adapters 704, a chamber bottom 706, and a lid assembly 708 that enclose an interior volume 710 or plasma zone. The chamber body 701 is typically fabricated by machining and welding plates of stainless steel or by machining a single mass of aluminum. In some embodiments, the lower adapters 704 comprise aluminum and the chamber bottom 706 comprises stainless steel. The chamber bottom 706 generally contains a slit valve (not shown) to provide for entry and egress of the wafer 100a from the processing chamber 700. The lid assembly 708 of the processing chamber 700 in cooperation with the ground shield 760 that interleaves with the cover ring 770 confines a plasma formed in the interior volume 710 to the region above the substrate.

The pedestal assembly 720 is supported from the chamber bottom 706 of the chamber 700. The pedestal assembly 720 supports the deposition ring 780 along with the wafer 100a during processing. The pedestal assembly 720 is coupled to the chamber bottom 706 of the chamber 700 by a lift mechanism 722 that is configured to move the pedestal assembly 720 between an upper and lower position. Additionally, in the lower position, lift pins (not shown) are moved through the pedestal assembly 720 to space the substrate from the pedestal assembly 720 to facilitate exchange of the substrate with a wafer transfer mechanism disposed exterior to the processing chamber 700, such as a single blade robot (not shown). A bellows 724 is typically disposed between the pedestal assembly 720 and the chamber bottom 106 to isolate the interior volume 710 of the chamber body 701 from the interior of the pedestal assembly 720 and the exterior of the chamber.

The pedestal assembly 720 generally includes a substrate support 726 sealingly coupled to a base plate 728 which is coupled to a ground plate 725. The substrate support 726 may be comprised of aluminum or ceramic. The substrate support 726 may be an electrostatic chuck, a ceramic body, a heater or a combination thereof. In some embodiments, the substrate support 726 is an electrostatic chuck that includes a dielectric body having electrodes 738 embedded therein. The dielectric body is typically fabricated from a high thermal conductivity dielectric material such as pyrolytic boron nitride, aluminum nitride, silicon nitride, alumina or an equivalent material. As shown in FIG. 9, the substrate support 726 has a bottom surface 754. The vertical distance "V" between the bottom surface 754 and the substrate receiving surface 727 is between about, such as between about 0.30 to about 0.75 inches (about 0.76 to about 1.91 centimeter), for example 0.25 inches (0.64 centimeter). Returning to FIG. 9, in some embodiments, the substrate support 726 is attached to the base plate 728 by a metal foil 712, such as an aluminum foil, which diffusion bonds the base plate 728 and the substrate support 726.

The base plate 728 may comprise a material having thermal properties that are suitably matched to the overlying substrate support 726. For example, the base plate 128 can comprise a composite of ceramic and metal, such as aluminum silicon carbide, which provides better strength and durability than ceramic alone and also has good heat transfer properties. The composite material has a thermal expansion coefficient that is matched to the material of the substrate support 726 to reduce thermal expansion mismatch. In one version, the composite material comprises a ceramic having pores that are infiltrated with a metal, which at least partially fills the pores to form a composite material. The ceramic may comprise, for example, at least one of silicon carbide, aluminum nitride, aluminum oxide or cordierite. The ceramic may comprise a pore volume of from about 20 to about 80 volume % of the total volume, the remainder volume being of the infiltrated metal. The infiltrated metal can comprise aluminum with added silicon and may also contain copper. In another version, the composite may comprise a different composition of a ceramic and metal, such as metal having dispersed ceramic particles; or the base plate 728 can be made from only a metal, such as stainless steel or aluminum. A cooling plate (not shown) is generally disposed within the base plate 728 to thermally regulate the substrate support 726, but may also be disposed within the ground plate 725.

The ground plate 725 is typically fabricated from a metallic material such as stainless steel or aluminum. The base plate 728 may be coupled to the ground plate by a plurality of connectors 737. The connectors 737 may be one of a bolt, screw, key, or any other type of connector. The base plate 728 may be removable from the ground plate 725 for facilitating easier replacement and maintenance of the substrate support 726 and base plate 728.

The substrate support 726 has a substrate receiving surface 727 that receives and supports the wafer 100a during processing, the surface 727 having a plane substantially parallel to a sputtering surface 733 of the target 732. The substrate support 726 also has a peripheral edge 729 that terminates before an overhanging edge of the wafer 100a. The peripheral edge 729 of the substrate support 726 has a diameter between about 275 mm to about 300 mm. As discussed above, the substrate support 126 is taller than conventional support, having a height greater than about 0.25 inches (about 0.64 centimeter), such as between about 0.30 to about 0.75 inches (about 0.76 to about 1.91 centimeter). The relatively tall height of the substrate support 726 beneficially spaces the substrate vertically from the horizontal surfaces of a deposition ring 780 of a process kit 750, as further described below.

The lid assembly 708 generally includes a target backing plate 730, a target 732, and a magnetron 734. The target backing plate 730 is supported by the upper adapters 702 when in a closed position, as shown in FIG. 9. A ceramic ring seal 736 is disposed between the target backing plate 730 and upper adapters 702 to prevent vacuum leakage therebetween.

The target 732 is coupled to the target backing plate 730 and exposed to the interior volume 710 of the processing chamber 700. The target 732 provides material which is deposited on the substrate during a PVD process. An isolator ring 798 is disposed between the target 732, target backing plate 130, and chamber body 701 to electrically isolate the target 732 from the target backing plate 730 and the upper adapter 702 of the chamber body 701.

The target 732 is biased with RF and/or DC power relative to ground, e.g. the chamber body 701, by a power source 740. A gas, such as argon, is supplied to the interior volume 710 from a gas source 742 via conduits 744. The gas source 742 may comprise a non-reactive gas such as argon or xenon, which is capable of energetically impinging upon and sputtering material from the target 732. The gas source 742 may also include a reactive gas, such as one or more of an oxygen-containing gas, a nitrogen-containing gas, a methane-containing gas, that are capable of reacting with the sputtering material to form a layer on a substrate. Spent process gas and byproducts are exhausted from the chamber 700 through exhaust ports 746 that receive spent process gas and direct the spent process gas to an exhaust conduit 748 having a throttle valve to control the pressure of the gas in the chamber 700. The exhaust conduit 748 is connected to one or more exhaust pumps 749. Typically, the pressure of the sputtering gas in the chamber 700 is set to sub-atmospheric levels, such as a vacuum environment, for example, gas pressures of 0.6 mTorr to 400 mTorr. A plasma is formed from the gas between the wafer 100a and the target 732. Ions within the plasma are accelerated toward the target 732 and cause material to become dislodged from the target 732. The dislodged target material is deposited on the substrate. The magnetron 734 is coupled to the target backing plate 730 on the exterior of the processing chamber 700.

Processes performed in the chamber 700 are controlled by a controller 790 that comprises program code having instruction sets to operate components of the chamber 700 to facilitate processing of substrates in the chamber 700. For example, the controller 790 can comprise program code that includes a substrate positioning instruction set to operate the pedestal assembly 720; a gas flow control instruction set to operate gas flow control valves to set a flow of sputtering gas to the chamber 700; a gas pressure control instruction set to operate a throttle valve to maintain a pressure in the chamber 700; a temperature control instruction set to control a temperature control system (not shown) in the pedestal assembly 720 or lower adapter 704 to set temperatures of the substrate or lower adapters 704, respectively; and a process monitoring instruction set to monitor the process in the chamber 700.

The process kit 750 comprises various components that can be easily removed from the chamber 700, for example, to clean sputtering deposits off the component surfaces, replace or repair eroded components, or to adapt the chamber 700 for other processes. In some embodiments, the process kit 750 includes at least the deposition ring 780, but may also include the ground shield 760 and the cover ring 770. In some embodiments, the cover ring 770 and deposition ring 780 are placed about the peripheral edge 729 of the substrate support 726.

The ground shield 760 is supported by the chamber body 701 and encircles the sputtering surface 733 of a sputtering target 732 that faces the substrate support 726. The ground shield 760 also surrounds the peripheral edge 729 of the substrate support 726. The ground shield 760 covers and shadows the lower adapters 704 of the chamber 700 to reduce deposition of sputtering deposits originating from the sputtering surface 733 of the sputtering target 732 onto the components and surfaces behind the ground shield 760.

Figure 2D:
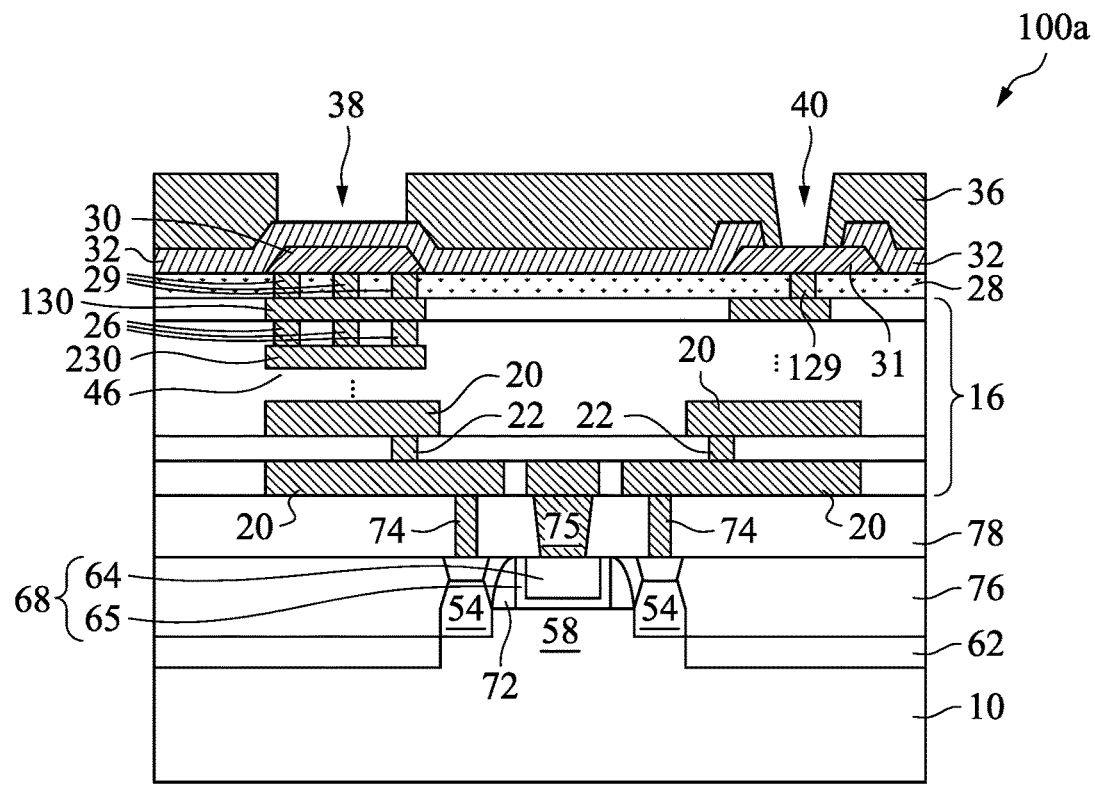

Referring back to FIG. 1, the method M then proceeds to block S104 where a passivation layer and polymer are formed over the metal pads. With reference to FIG. 2D, in some embodiments of block S104, a passivation layer 32 is formed over the passivation layer 28. The material of the passivation layer 32 may be selected from the same candidate materials of the passivation layer 28. The passivation layers 28 and 32 may be formed of a same dielectric material, or may be formed of different dielectric materials. In some embodiments, the passivation layer 32 may include a silicon oxide layer, and a silicon nitride layer over the silicon oxide layer. The passivation layer 32 is patterned, so that a portion of the passivation layer 32 covers the edge portions of the aluminum pad 31, and a central portion of the aluminum pad 31 is exposed through an opening in the passivation layer 32. An entirety of the aluminum pad 30 is covered by passivation layer 32. The passivation layer 32 may also include a portion level with the metal pad 30.

Subsequently, a polymer layer 36 is formed over the passivation layer 32. The polymer layer 36 may include a polymer selected from polyimide, benzocyclobutene (BCB), polybenzoxazole (PBO), and/or the like. The formation methods may include spin coating, for example. The polymer layer 36 may be dispensed in a liquid form, and then cured. The polymer layer 36 may be patterned to form openings 38 and 40. The opening 40 may be aligned to a portion of the aluminum pad 31, wherein the aluminum pad 31 is exposed through the opening 40. The opening 38 overlaps the aluminum pad 30. In some embodiments, the opening 38 has a top view size and a top-view shape similar to the top view sizes and the top-view shapes of the aluminum pad 30, the metal pad 130, and/or the metal pad 230. The passivation layer 32 is exposed through the opening 38. In some embodiments, the patterning of the polymer layer 36 is performed using the passivation layer 32 as an etch stop layer. In the embodiments that the polymer layer 36 is formed of a photo-sensitive material, the polymer layer 36 is patterned by exposing to light through a lithography mask (not shown). The exposed polymer layer 36 is then developed to form the openings 38 and 40.

Figure 2E:
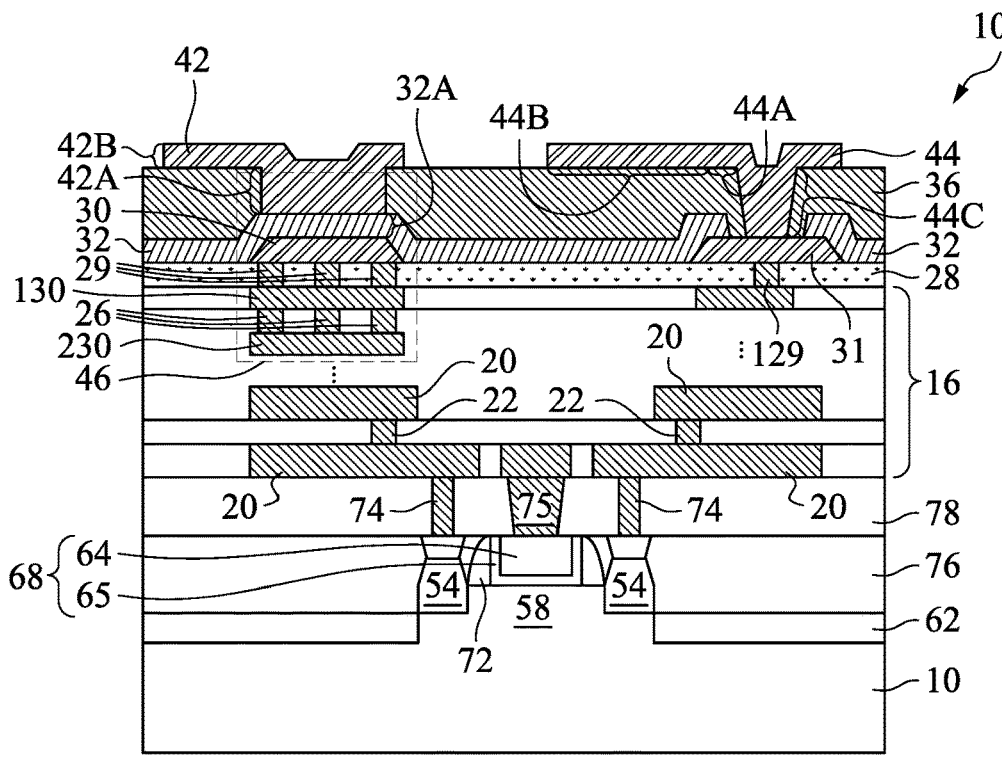

Referring back to FIG. 1, the method M then proceeds to block S105 where a post-passivation interconnect structures are formed over the wafer. With reference to FIG. 2E, in some embodiments of block S105, post-passivation interconnect structures 42 and 44, which are such named since the formation of the post-passivation interconnect structures 42 and 44 is after the formation of passivation layer 32, are formed over the polymer layer 36. In some embodiments, the formation of the post-passivation interconnects 42 and 44 includes depositing a seed layer (not shown), forming a patterning mask (not shown) over the seed layer, and plating a metallic material (not shown) over the seed layer. The mask layer is then removed, and the portions of the seed layer covered by the mask layer are removed. The remaining portions of the seed layer and the metallic material form post-passivation interconnect structures 42 and 44. The post-passivation interconnect structure 42 may include a portion 42A, which is in the opening 38 (see FIG. 2D) and a portion 42B overlying the polymer layer 36. The post-passivation interconnect portion 42A, the metal pad 30, and the portion 32A of the passivation layer 32 therebetween in combination may form a capacitor 46, in which the post-passivation interconnect portion 42A may act as a top capacitor electrode of the capacitor 46, the metal pad 30 may act as a bottom capacitor electrode of the capacitor 46, and the passivation portion 32A may act as a capacitor insulator. The post-passivation interconnect structure 44 may include a post-passivation interconnect line 44A and a post-passivation interconnect pad 44B, which is wider (in the top view) than the post-passivation interconnect line 44A. The post-passivation interconnect structure 44 may further include a portion 44C extending into the opening 40 (see FIG. 2D) to electrically connect to the aluminum pad 31.

Figure 2F:
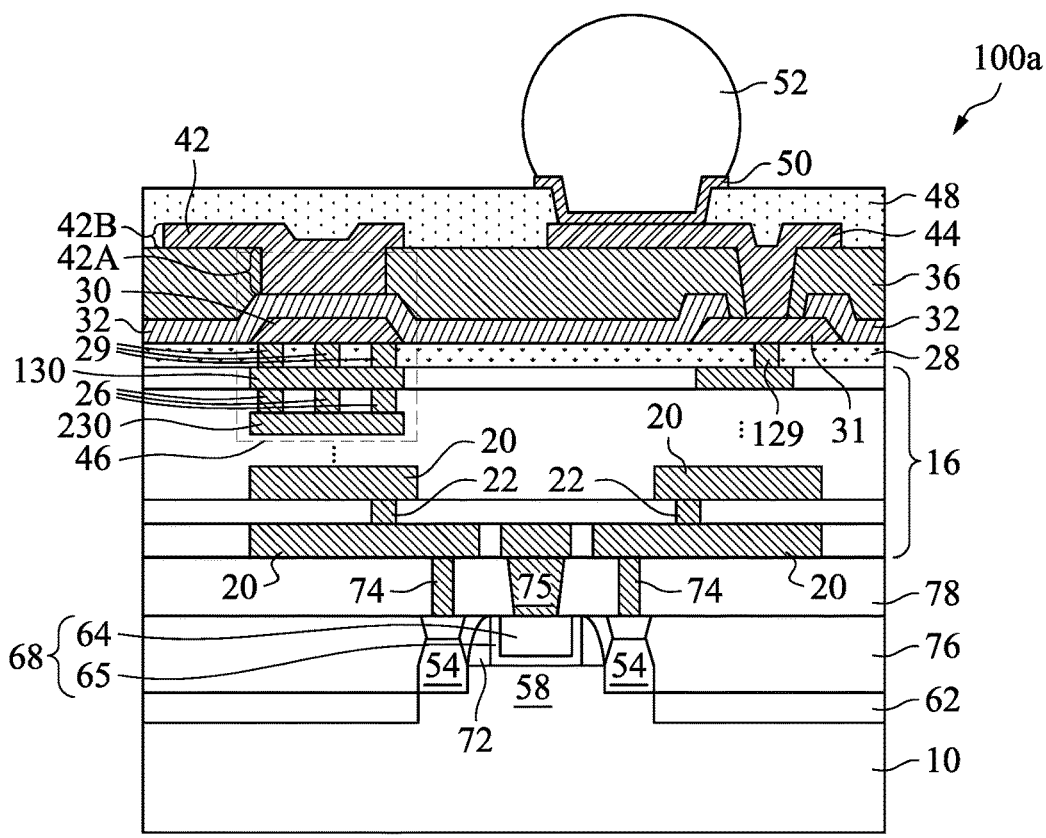

Referring back to FIG. 1, the method M then proceeds to block S106 where an under-bump-metallurgy and a connector are formed over the wafer. With reference to FIG. 2F, in some embodiments of block S106, a polymer layer 48 is formed over the structure shown in FIG. 2E. The polymer layer 48 may be formed of a material selected from the same group of candidate materials for forming the polymer layer 36. For example, the polymer layer 48 may comprise polyimide or another polymer-based material such as polybenzoxazole (PBO), benzocyclobutene (BCB), or the like. The polymer layer 48 may be formed using spin coating.

Subsequently, the under-bump-metallurgy (UBM) layer 50 is formed. In some embodiments, the UBM layer 50 includes a barrier layer and seed layer (not shown) over the barrier layer. The UBM layer 50 may extend into the opening in the polymer layer 48, and is electrically coupled to, and may be in physical contact with, the post-passivation interconnect structure 44. The barrier layer may be a titanium layer, a titanium nitride layer, a tantalum layer, a tantalum nitride layer, or layers formed of a titanium alloy or a tantalum alloy. The materials of the seed layer may include copper or copper alloys. The UBM layer 50 may be formed using PVD or other applicable methods. In some embodiments, an entirety of the post-passivation interconnect structure 42 is covered by the polymer layer 48. Alternatively, a UBM similar to UBM 50 and a connector similar to a connector 52 may be formed to electrically connect to the post-passivation interconnect structure 42.

Subsequently, the connector 52 is formed. In some embodiments, the connector 52 is a metal region, which is either a metal ball, such as a solder ball or a copper ball, placed on the UBM layer 50, or a metal pillar formed on the UBM layer 50 through plating. The metal region may then go through a reflow process, and a metal ball 52 is formed. In alternative embodiments, the connector 52 comprises a metal pillar, which may be a copper pillar. Additional layers such as a nickel layer, a solder cap, a palladium layer, and the like, may also be formed on the metal pillar.

Figure 11:
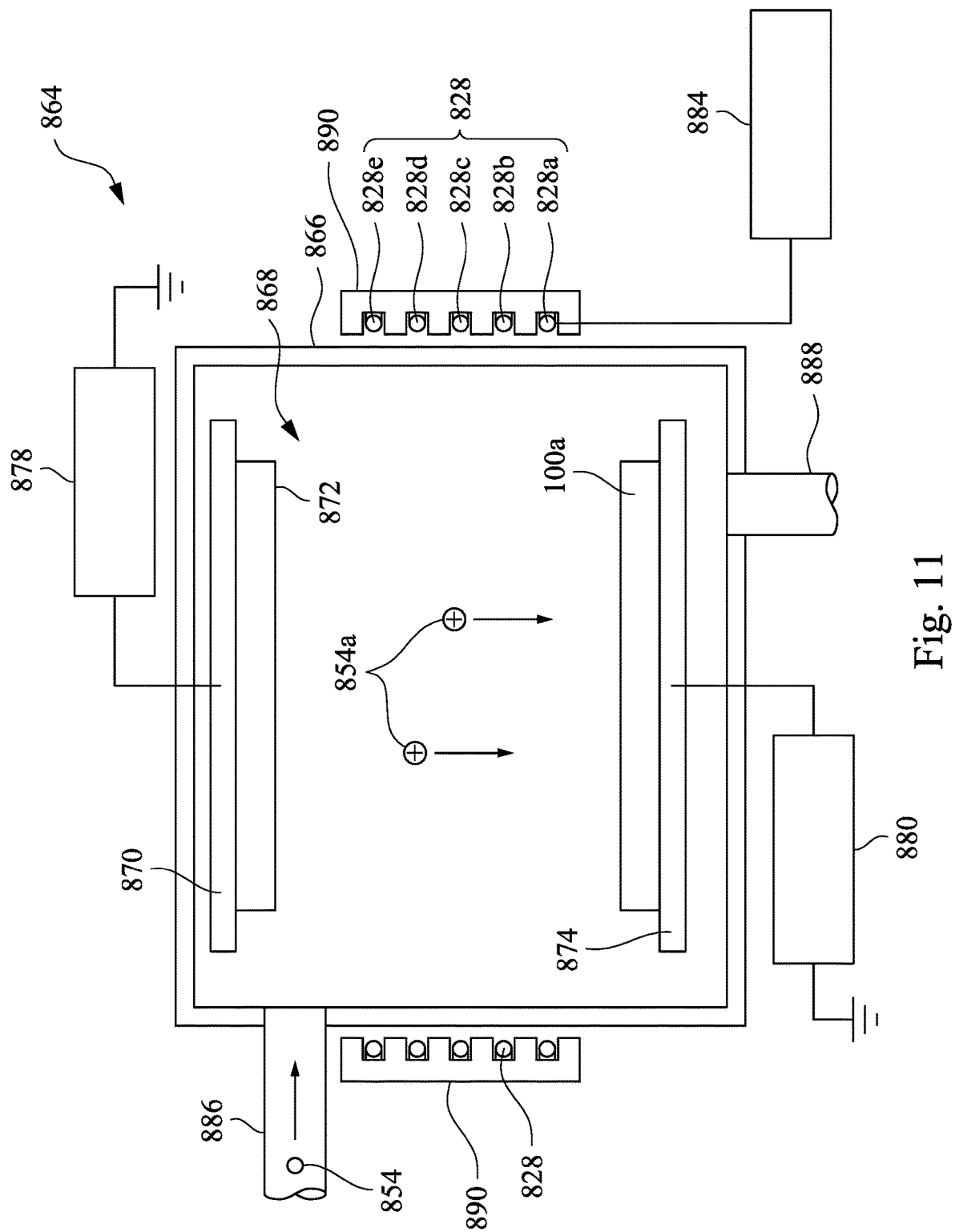
FIG. 11 illustrates a cross-sectional view of a semiconductor processing tool in accordance with some embodiments of the present disclosure.

Based on the above discussions, it is understood that the movable jig in the present disclosure can be applied to apparatus that has RF coil. With reference to FIG. 2A, in some embodiments, barrier layers (not shown) of interconnect structure 16 may be formed through a semiconductor processing tool 800 having RF coil 828 as shown in FIG. 11. In some embodiments, barrier layers of the interconnect structure 16 may include a conducting material, for example, metals such as Al, Ti, TiN, TaN, Co, Ag, Au, Ni, Cr, Hf, Ru, W, Pt, WN, Ru, any other suitable material or a combination or alloy thereof. In some embodiments, the semiconductor processing tool 800 shown in FIG. 11 may be a processing chamber of the system 300 as shown in FIG. 10.

Referring to FIG. 11, the process for forming the barrier layers of interconnect structure 16 may be carried out in a sputtering chamber 864. The sputtering chamber 864 may be also called a physical vapor deposition (PVD) chamber, capable of depositing metal or ceramic materials, such as for example, titanium, aluminum oxide, aluminum, copper, tantalum, tantalum nitride, tantalum carbide, tungsten, tungsten nitride, lanthanum, lanthanum oxides, titanium nitride, nickel, and NiPt, among others. The sputtering chamber 864 may include a chamber wall 866 that defines a chamber interior 868. A source electrode 870, connected to a source DC supply 878, is provided in the top of the chamber interior 868. A bias electrode 874, connected to a bias DC supply 880, is provided in the bottom of the chamber interior 868. The bias electrode 874 serves as a substrate support to support the wafer 100a during the PVD process. The RF coil 828 surrounds the sputtering chamber 864 and is connected to an RF generator 884. In some embodiments, the RF coil 828 may have a configuration substantially the same as the RF coil 428 as shown in FIGS. 3A-4B. The RF coil 828 may have a plurality of coil segments 828a, 828b, 828c, 828d, and 828e arranged along a direction in parallel to an outer sidewall 864a of the sputtering chamber 864 as shown in the cross section of FIG. 11. A gas inlet 886 and a gas outlet 888 gaseously communicate with the chamber interior 868 for the introduction of argon gas 854 into and the evacuation of reaction products and unreacted plasma from, respectively, the chamber interior 868. A metal target 872 is provided in contact with the source electrode 870 for the sputtering of metal ions 872b from the target 872 onto the semiconductor substrate 10 to form the barrier layers. Accordingly, the metal target 872 is composed of the same metal as the barrier layers.

The sputtering step may be carried out by placing the wafer 100a on the bias electrode 874 in the sputtering chamber 864 to form the barrier layers. As the source DC supply 878 applies a negative voltage to the source electrode 870 and metal target 872, argon gas 854 is introduced into the chamber interior 868 through the gas inlet 886. The RF power applied to the RF coils 828 by the RF generator 884 forms an RF field which ionizes the argon gas 854 into plasma, generating positive argon ions 854a. The argon ions 854a strike the metal target 872, dislodging metal atoms 872a from the target 872. The RF field ionizes the dislodged metal atoms 872a to form positive metal ions 872b. Simultaneously, the bias DC supply 880 applies a bias power voltage to the bias electrode 874 and the semiconductor substrate 10. The positive metal ions 872b may move down to the negatively-charged semiconductor substrate 10, causing the metal ions 872b to strike and combine with layers over the semiconductor substrate 10 to form the barrier layers.

The RF coil 828 allows control of the ion distribution and density in the sputtering chamber 864 of the semiconductor processing tool 800, thereby improving plasma uniformity. Because the electrical field used to dissociate the process gas to form the plasma is generated by the RF coil 828, the uniformity of the plasma may be affected by the structure of the RF coil 828. For example, if adjacent two coil segments of the RF coil 828 have a variable gap therebetween, the RF coil 828 will cause an uneven distribution of the plasma in the sputtering chamber 864. The uneven distribution of the plasma may cause different sputter deposition rates on the different regions of the wafer 100a. Therefore, the present disclosure in various embodiments provides a movable jig 890 in the semiconductor processing tool 800. The movable jig 890 is used to confine any adjacent two coil segments 828a-828e of the RF coil 828 in a fixed gap along a spiral direction S2, before and/or during the sputter deposition process for forming the barrier layers. The movable jig 890 may have a configuration or an operation substantially the same as the movable jig 490 as shown in FIGS. 3A-4D, the movable jig 590 as shown in FIGS. 5A-5C, or the movable jig 690 as shown in FIGS. 6A-8B. As a result, uniformity of the plasma in the sputtering chamber 864 can be increased, which in turn improves uniformity of sputter deposition rates on different regions of the wafer 100a.

Figure 12:
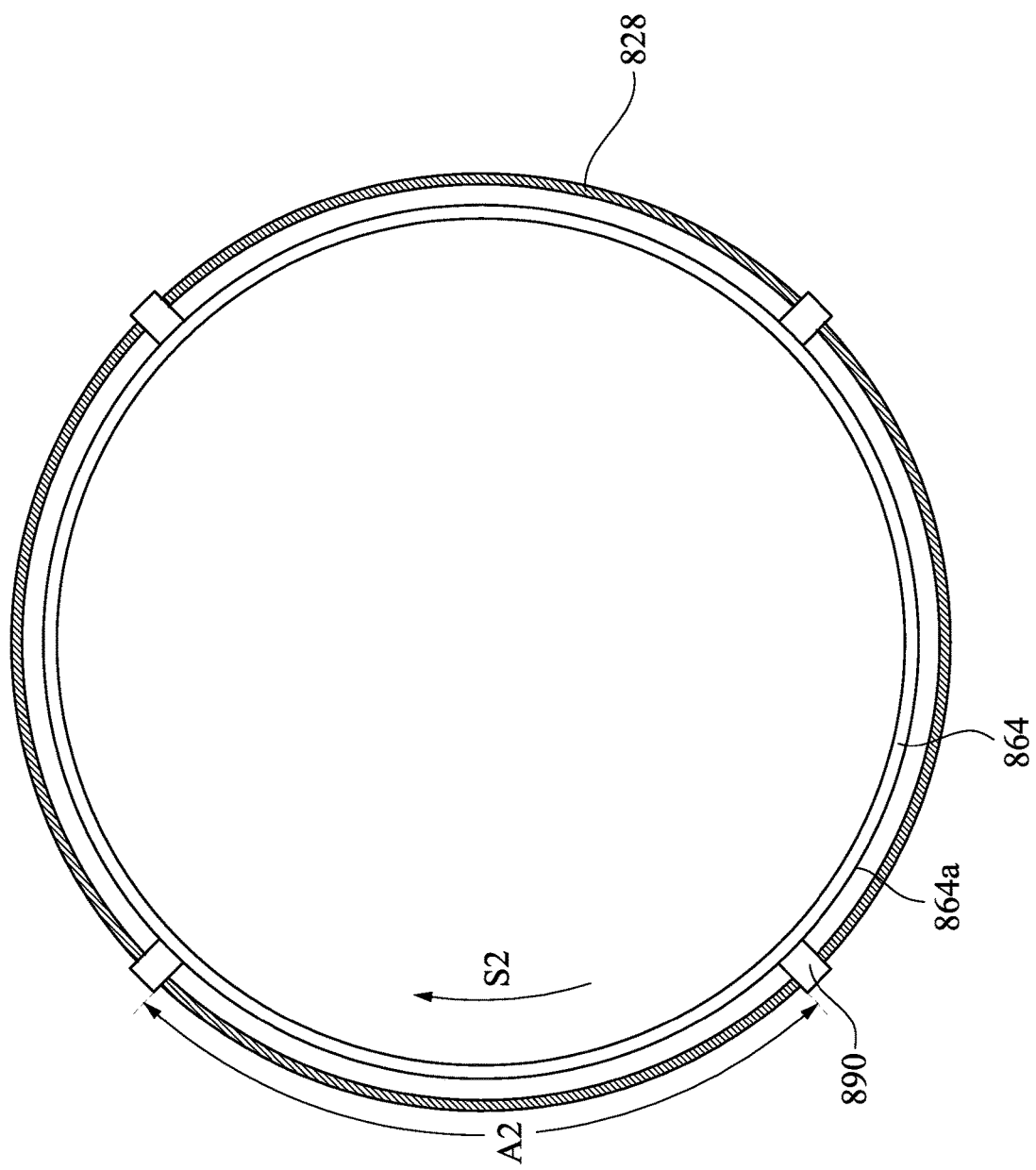
FIG. 12 illustrates a top view of a sputtering chamber of the semiconductor processing tool with a movable jig in accordance with some embodiments of the present disclosure.

As shown in FIG. 12, the movable jig 890 is operable to horizontally move along the outer sidewall 864a of the sputtering chamber 864 in a predetermined arc length A2 to confirm adjacent two of the coil segments 828a, 828b, 828c, 828d, and 828e (see FIG. 11) are vertically spaced apart from each other by a predetermined distance in the predetermined arc length A2. In some embodiments, the movable jig 890 may be operable to horizontally travel a radian along the outer sidewall 864a of the sputtering chamber 864 in a range from about 0 to about 360°. By way of example and not limitation, the movable jig 890 may be operable to horizontally travel a radian, such as about 20°, 40°, 60°, 80°, 90°, 120°, 140°, 160°, 180°, 200°, 220°, 240°, 260°, 280°, 300°, 320°, or 340°. In some embodiments, there is a plurality of the movable jig 890 movably mounted on the outer sidewall 864*a* of the sputtering chamber 864.

Based on the above discussions, it can be seen that the present disclosure offers advantages. It is understood, however, that other embodiments may offer additional advantages, and not all advantages are necessarily disclosed herein, and that no particular advantage is required for all embodiments. In order to perform a plasma etching process on a processing wafer to remove oxide over the metal layer, a RF resonator including a spiral-shaped RF coil is provided. Because the electrical field used to dissociate the process gas to form the plasma is generated by the spiral-shaped RF coil, the uniformity of the plasma may be affected by the structure of the spiral-shaped RF coil. For example, adjacent two coil segments of the spiral-shaped RF coil has a variable gap therebetween may cause an uneven distribution of the plasma over the wafer. The uneven distribution of the plasma may cause different ions sputter etch rate on the different regions of the wafer, such that the oxide on the wafer may not be completely removed which in turn deteriorates electrical contact between the subsequently deposited metal and the underlying metal layer and may cause voltage breakdown (VBD) fail to the wafer.

Therefore, the present disclosure in various embodiments provides a movable jig installed in the RF resonator. The movable jig is used to position the spiral-shaped RF coil on the inner sidewall of the RF resonator to confine any adjacent two coil segments of the spiral-shaped RF coil in a fixed gap along a spiral direction, before and/or during the plasma etching process. As a result, the plasma uniformity can be improved, which in turn improves etch rates on different regions of the wafer, such that the oxide on the wafer may be completely removed to improve the electrical contact between the subsequently deposited metal and the underlying metal layer.

In some embodiments, the method includes placing a wafer in a chamber body of a plasma processing tool; moving a first movable jig along an arc path to comb a spiral-shaped radio frequency (RF) coil over the chamber body, the first movable jig having a plurality of first confining slots penetrated by a plurality of coil segments of the spiral-shaped RF coil, respectively; and generating plasma in the chamber body through the spiral-shaped RF coil. In some embodiments, moving the first movable jig to comb the spiral-shaped RF coil is performed prior to generating the plasma in the chamber body through the spiral-shaped RF coil. In some embodiments, moving the first movable jig to comb the spiral-shaped RF coil is performed during generating the plasma through the spiral-shaped RF coil. In some embodiments, the method further includes: moving a second movable jig to comb the spiral-shaped RF coil. In some embodiments, the first movable jig is made of at least one of polytetrafluoroethylene (PTFT), steel, stainless steel, nickel, or aluminum. In some embodiments, the method further includes: detecting a gap between coil segments of the spiral-shaped RF coil by pressure sensors disposed in the first confining slots of the first movable jig. In some embodiments, the method further includes: determining whether the detected gap is abnormal; and in response to the determination determines that, the detected gap is abnormal, stopping generating the plasma in the chamber body. In some embodiments, the first movable jig is disposed in an RF resonator over the chamber body, and partial regions of the spiral-shaped RF coil are fixed by a fixed jig fixed to the RF resonator, the fixed jig having a plurality of second confining slots penetrated by the plurality of coil segments of the spiral-shaped RF coil. In some embodiments, the plurality of second confining slots of the fixed jig have a width less than a width of the plurality of first confining slots of the first movable jig. In some embodiments, the plurality of first confining slots of the first movable jig face a first direction, and the plurality of second confining slots of the fixed jig face a second direction opposite the first direction.

In some embodiments, the method includes disposing a wafer in a chamber body of a plasma processing tool and below a spiral-shaped radio frequency (RF) coil, the spiral-shaped RF coil having coil segments respectively extending through confining slots of a movable comb; changing a first local distance between coil segments of the spiral-shaped RF coil by changing a vertical distance between the confining slots of the movable comb; and generating plasma in the chamber body through the spiral-shaped RF coil. In some embodiments, the first local distance between the coil segments is increased by increasing the vertical distance between the confining slots of the movable comb. In some embodiments, the first local distance between the coil segments is decreased by decreasing the vertical distance between the confining slots of the movable comb. In some embodiments, a second local distance between the coil segments of the spiral-shaped RF coil remains constant during changing the first local distance between the coil segments. In some embodiments, the method further includes: moving the movable comb to comb the spiral-shaped RF coil in a clockwise or counterclockwise direction. In some embodiments, a fixed comb holding the spiral-shaped RF coil is kept stationary during changing the first local distance between the coil segments of the spiral-shaped RF coil.

In some embodiments, a plasma processing tool includes a chamber body, a substrate support, a spiral radio frequency (RF) coil, a movable jig, and a radio frequency power source. The substrate support is in the chamber body. The spiral RF coil is above the substrate support. The movable jig has confining legs laterally extending past coil segments of the spiral RF coil. The confining legs and the coil segments are arranged in an alternating manner. The movable jig is movable along an arc path. The radio frequency power source is connected to the spiral RF coil. In some embodiments, the plasma processing tool further includes a belljar and a housing. The belljar is over the chamber body. The houding is over the belljar. The spiral RF coil is on an inner sidewall of the housing and the movable jig is movable along the inner sidewall of the housing in a clockwise or counterclockwise direction. In some embodiments, the plasma processing tool further includes a plurality of pressure sensors disposed on opposite sidewalls of the confining legs of the movable jig, respectively. In some embodiments, the spiral RF coil is disposed on an outer sidewall of the chamber body. The movable jig is movable along the outer sidewall of the chamber body.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
placing a wafer in a chamber body of a plasma processing tool;
moving a first movable jig along an arc path to comb a spiral-shaped radio frequency (RF) coil over the chamber body, the first movable jig having a plurality of first confining slots penetrated by a plurality of coil segments of the spiral-shaped RF coil, respectively; and
generating plasma in the chamber body through the spiral-shaped RF coil, wherein moving the first movable jig to comb the spiral-shaped RF coil is performed prior to generating the plasma in the chamber body through the spiral-shaped RF coil.

2. The method of claim 1, wherein moving the first movable jig to comb the spiral-shaped RF coil is performed during generating the plasma in the chamber body through the spiral-shaped RF coil.

3. The method of claim 1, further comprising:
moving a second movable jig to comb the spiral-shaped RF coil.

4. The method of claim 1, wherein the first movable jig is made of at least one of polytetrafluoroethylene (PTFT), steel, stainless steel, nickel, or aluminum.

5. The method of claim 1, further comprising:
detecting a gap between coil segments of the spiral-shaped RF coil by pressure sensors disposed in the first confining slots of the first movable jig.

6. The method of claim 5, further comprising:
determining whether the detected gap is abnormal; and
in response to the determination determines that the detected gap is abnormal, stopping generating the plasma in the chamber body.

7. The method of claim 1, wherein the first movable jig is disposed in an RF resonator over the chamber body, and partial regions of the spiral-shaped RF coil are fixed by a fixed jig fixed to the RF resonator, the fixed jig having a plurality of second confining slots penetrated by the plurality of coil segments of the spiral-shaped RF coil.

8. The method of claim 7, wherein the plurality of second confining slots of the fixed jig have a width less than a width of the plurality of first confining slots of the first movable jig.

9. The method of claim 7, wherein the plurality of first confining slots of the first movable jig face a first direction, and the plurality of second confining slots of the fixed jig face a second direction opposite the first direction.

10. A method, comprising:
disposing a wafer in a chamber body of a plasma processing tool and below a spiral-shaped radio frequency (RF) coil, the spiral-shaped RF coil having coil segments respectively extending through confining slots of a movable comb;
changing a first local distance between coil segments of the spiral-shaped RF coil by changing a vertical distance between the confining slots of the movable comb; and
generating plasma in the chamber body through the spiral-shaped RF coil.

11. The method of claim 10, wherein the first local distance between the coil segments is increased by increasing the vertical distance between the confining slots of the movable comb.

12. The method of claim 10, wherein the first local distance between the coil segments is decreased by decreasing the vertical distance between the confining slots of the movable comb.

13. The method of claim 10, wherein a second local distance between the coil segments of the spiral-shaped RF coil remains constant during changing the first local distance between the coil segments.

14. The method of claim 10, further comprising:
moving the movable comb to comb the spiral-shaped RF coil in a clockwise or counterclockwise direction.

15. The method of claim 14, wherein a fixed comb holding the spiral-shaped RF coil is kept stationary during changing the first local distance between the coil segments of the spiral-shaped RF coil.

16. A plasma processing tool, comprising:
a chamber body;
a belljar over the chamber body;
a housing over the belljar;
a substrate support in the chamber body;
a spiral radio frequency (RF) coil above the substrate support, wherein the spiral RF coil is on an inner sidewall of the housing;
a movable jig having confining legs laterally extending past coil segments of the spiral RF coil, the confining legs and the coil segments being arranged in an alternating manner, and the movable jig being movable along an arc path, wherein the movable jig is movable along the inner sidewall of the housing in a clockwise or counterclockwise direction; and
a radio frequency power source connected to the spiral RF coil.

17. The plasma processing tool of claim 16, further comprising:
a plurality of pressure sensors disposed on opposite sidewalls of the confining legs of the movable jig, respectively.

18. The plasma processing tool of claim 16, wherein the spiral RF coil is disposed on an outer sidewall of the chamber body, and the movable jig is movable along the outer sidewall of the chamber body.

19. The method of claim 1, wherein moving the first movable jig is performed in a clockwise or counterclockwise direction along the arc path.

20. The plasma processing tool of claim 16, wherein the movable jig is made of at least one of polytetrafluoroethylene (PTFT), steel, stainless steel, nickel, or aluminum.

* * * * *